United States Patent
Chung et al.

(10) Patent No.: US 10,181,576 B2
(45) Date of Patent: Jan. 15, 2019

(54) DISPLAY DEVICE

(71) Applicant: SAMSUNG DISPLAY CO., LTD., Yongin-si, Gyeonggi-do (KR)

(72) Inventors: Yun-mo Chung, Yongin-si (KR); Ilhun Seo, Asan-si (KR); Hojin Yoon, Hwaseong-si (KR); Daewoo Lee, Hwaseong-si (KR); Minseong Yi, Hwaseong-si (KR); Miyeon Cho, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 6 days.

(21) Appl. No.: 15/661,640

(22) Filed: Jul. 27, 2017

(65) Prior Publication Data
US 2018/0076415 A1    Mar. 15, 2018

(30) Foreign Application Priority Data

Sep. 12, 2016  (KR) .......................... 10-2016-0117120

(51) Int. Cl.
| H01L 51/52 | (2006.01) |
| H01L 51/00 | (2006.01) |
| H01L 27/32 | (2006.01) |
| G09G 3/3266 | (2016.01) |

(52) U.S. Cl.
CPC ....... *H01L 51/5253* (2013.01); *G09G 3/3266* (2013.01); *H01L 27/3276* (2013.01); *H01L 51/5246* (2013.01); *G09G 2300/0426* (2013.01); *H01L 51/0097* (2013.01); *H01L 2251/5338* (2013.01)

(58) Field of Classification Search
CPC ............ H01L 51/5253; H01L 51/0097; H01L 51/5246; H01L 27/3276; G02F 2001/133388; G02F 1/1333; G02F 1/133
See application file for complete search history.

(56) References Cited

U.S. PATENT DOCUMENTS

| 9,110,320 | B2 | 8/2015 | Chen et al. |
| 9,324,959 | B2 | 4/2016 | Namkung et al. |
| 9,766,737 | B2 * | 9/2017 | Ahn ........................ G06F 3/041 |
| 2014/0042406 | A1 | 2/2014 | Degner et al. |
| 2014/0307396 | A1 * | 10/2014 | Lee ........................ H05K 1/028 361/749 |
| 2017/0371465 | A1 * | 12/2017 | Ahn .................... H01L 27/3262 |

FOREIGN PATENT DOCUMENTS

| KR | 101384950 B1 | 4/2014 |
| KR | 1020140085956 A | 7/2014 |

* cited by examiner

*Primary Examiner* — Christine Enad
(74) *Attorney, Agent, or Firm* — Cantor Colburn LLP

(57) ABSTRACT

A display device includes a display panel, and a protective member disposed outside the display panel. The circuit layer includes a display area and a non-display area, and a first bending line and a second bending line crossing the first bending line are defined are defined in the non-display area. The non-display area includes: a first non-display area bent from the display area with respect to the first bending line; a second non-display area bent from the display area with respect to the second bending line; and a corner non-display area bent from the second non-display area with respect to the first bending line and bent from the first non-display area with respect to the second bending line. A slit is defined in the protective member, and the slit overlap at least a part of the first bending line and the second bending line.

20 Claims, 21 Drawing Sheets

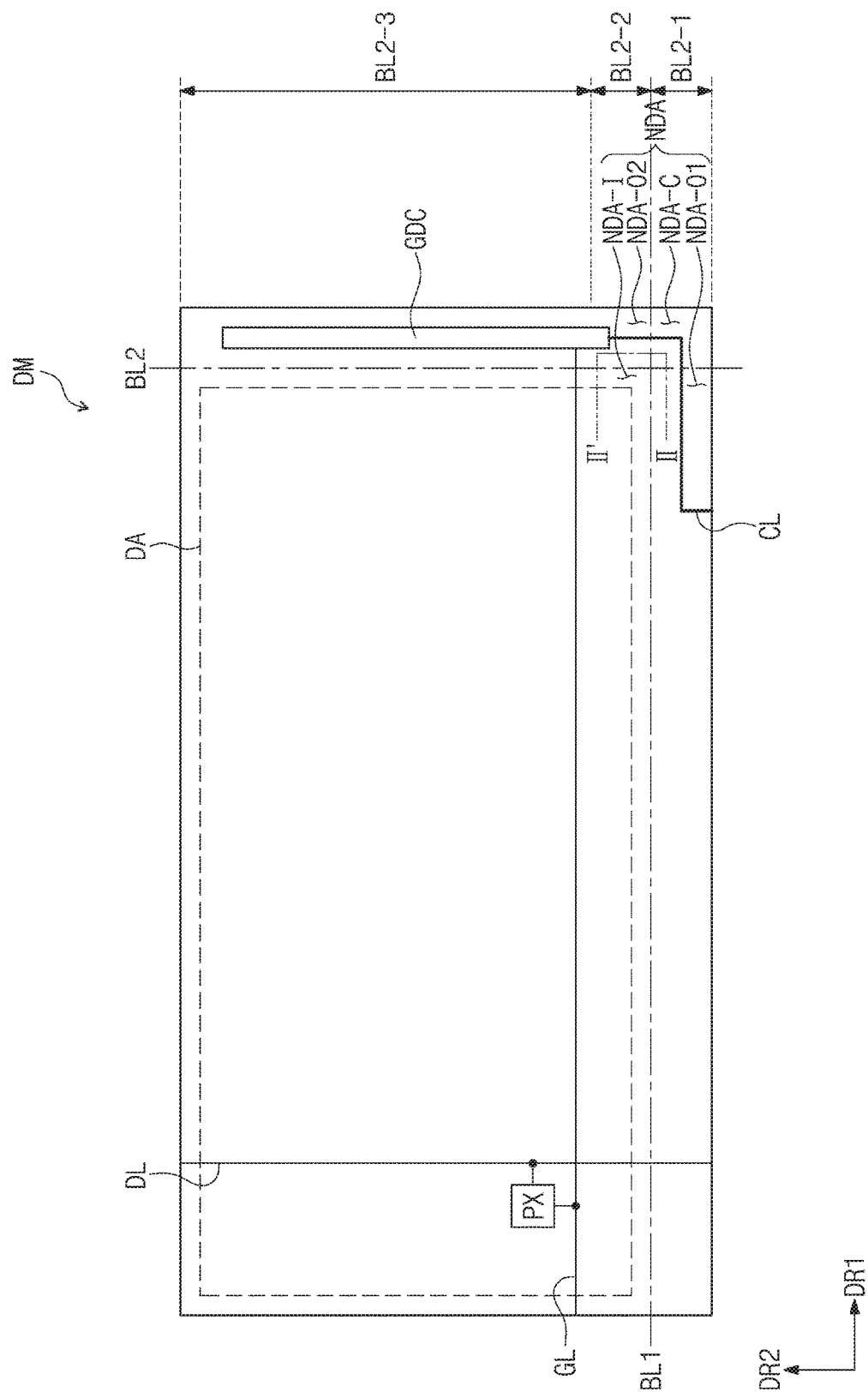

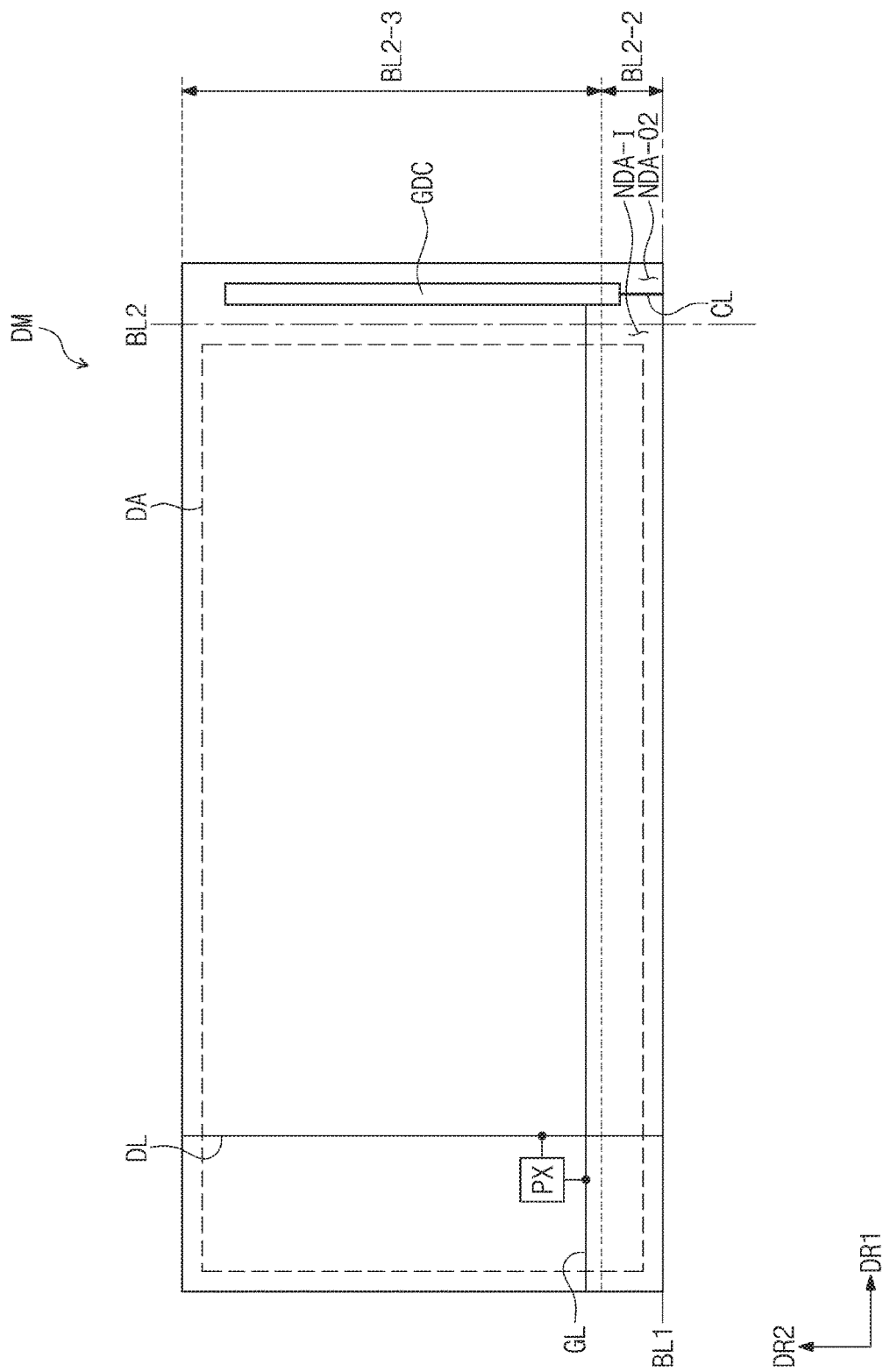

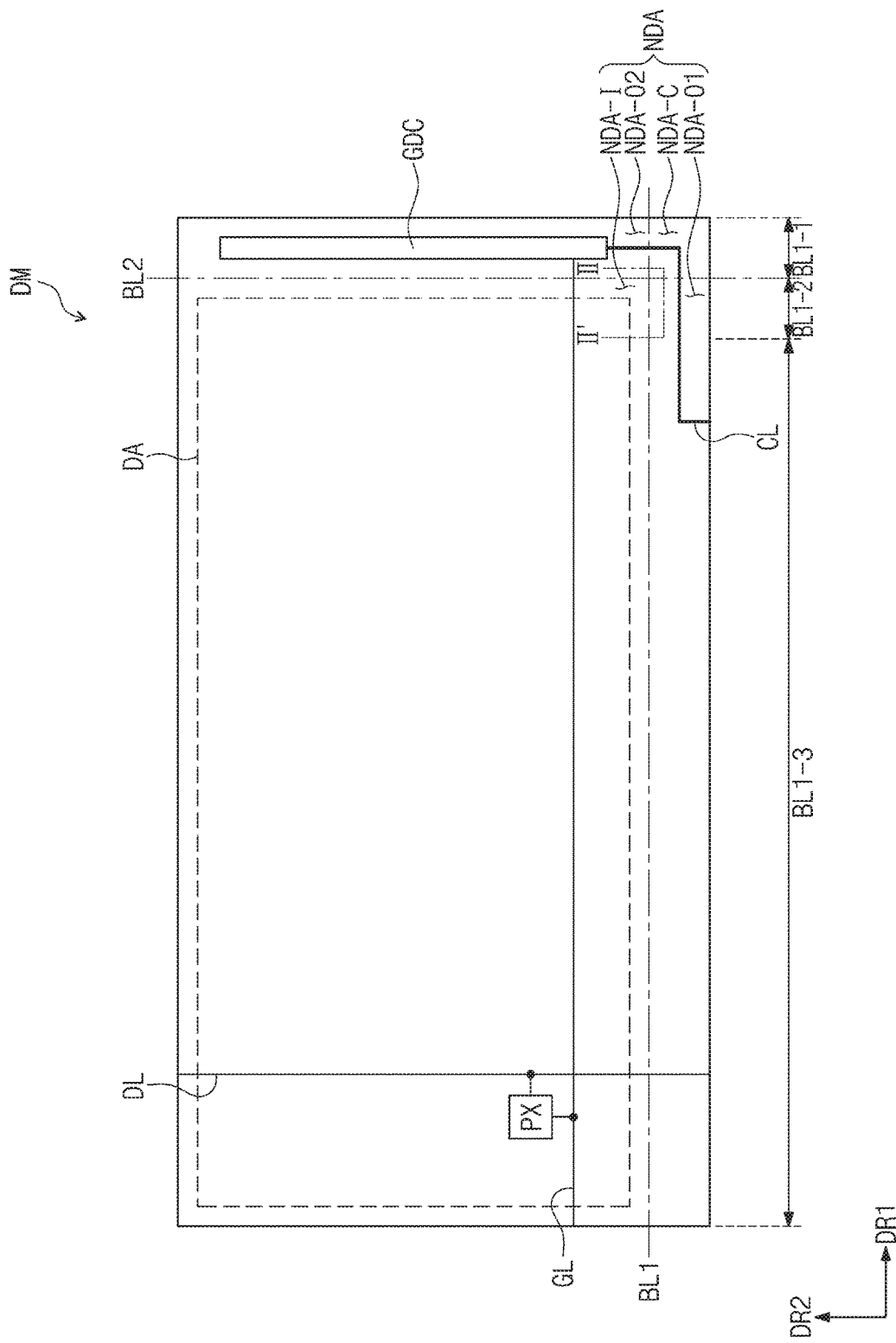

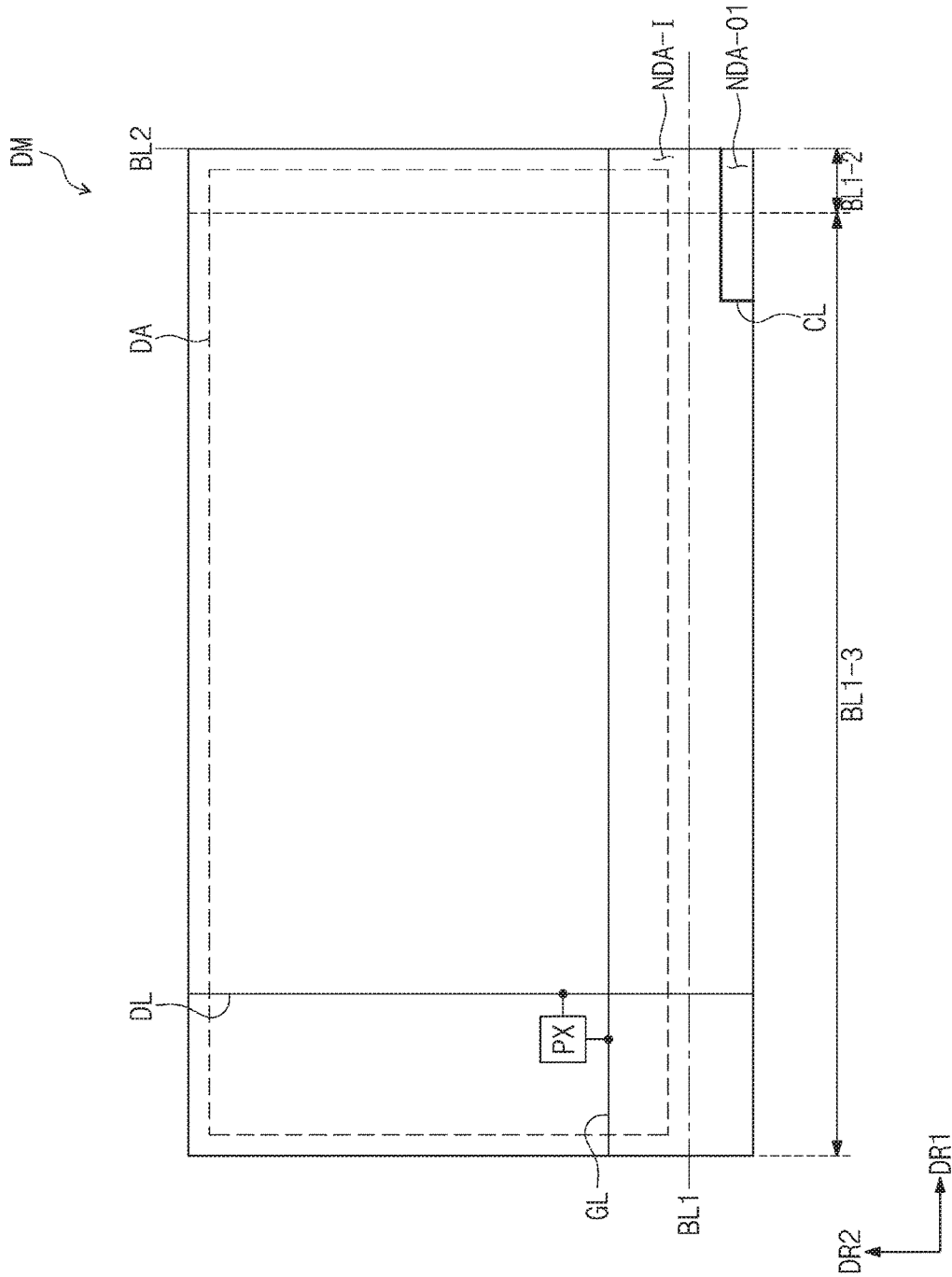

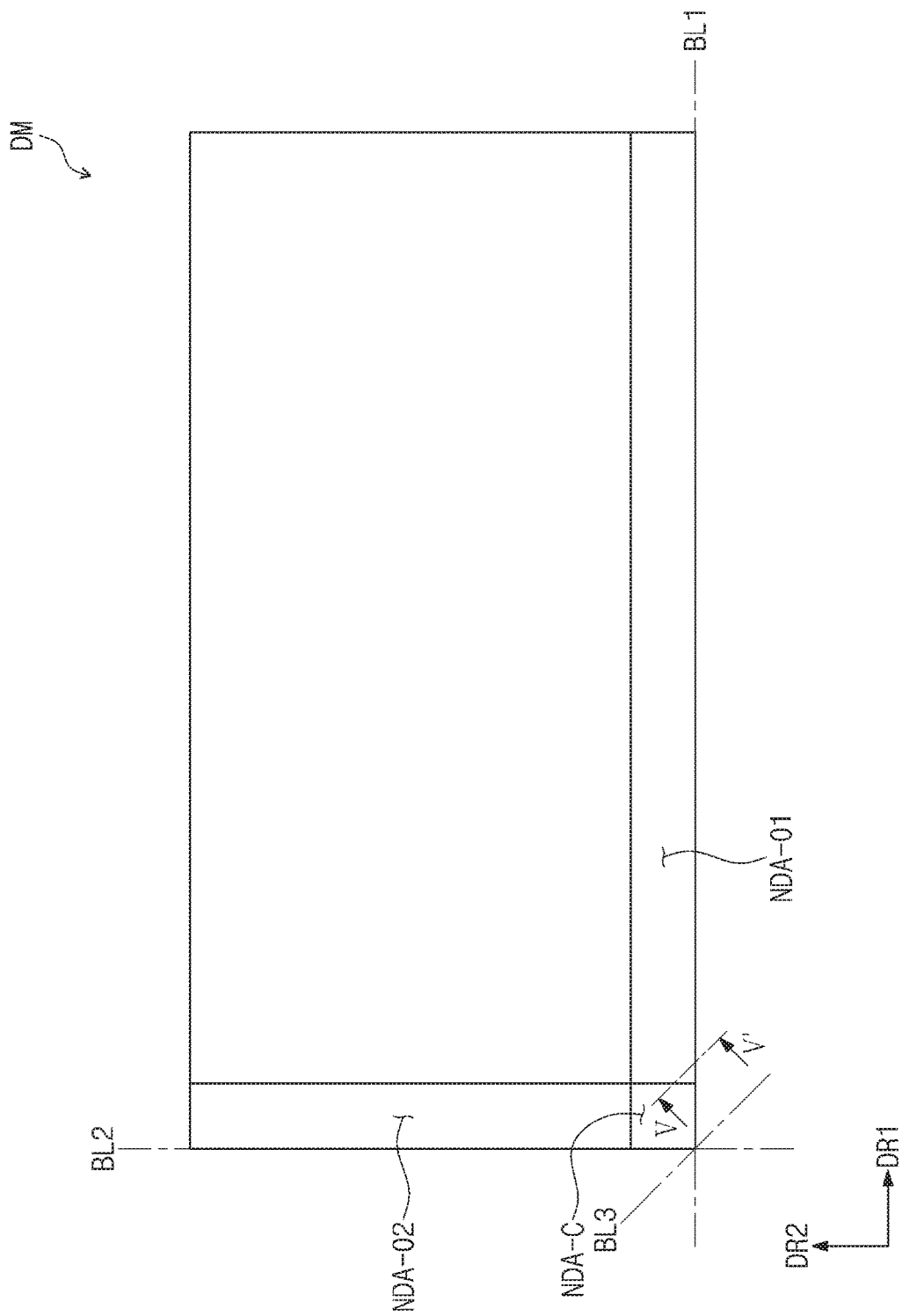

DISPLAY DEVICE

This application claims priority to Korean Patent Application No. 10-2016-0117120, filed on Sep. 12, 2016, and all the benefits accruing therefrom under 35 U.S.C. § 119, the content of which in its entirety is herein incorporated by reference.

BACKGROUND

1. Field

The disclosure herein relates to a display device, and more particularly, to a display device, a part of which is bent.

2. Description of the Related Art

Various display devices are widely used for an electronic device such as a television, a mobile phone, a tablet computer, a navigation device, and a game machine. Such an electronic device typically includes a display device and a protective cover for accommodating the display device. Additionally, the electronic device further includes at least one of various electronic modules depending on types of the electronic device.

SUMMARY

The disclosure provides a display device having a reduced bezel area.

An embodiment of the invention provides a display device including: a display panel including a circuit layer and a display element layer; and a protective member disposed outside the display panel. In such an embodiment, the circuit layer includes: a display area in which a pixel circuit is disposed; and a non-display area which is disposed in a periphery of the display area, and in which a first bending line and a second bending line crossing the first bending line are defined. In such an embodiment, the non-display area includes: a first non-display area disposed outside the first bending line and inside the second bending line, and bent from the display area with respect to the first bending line; a second non-display area disposed outside the second bending line and inside the first bending line, and bent from the display area with respect to the second bending line; and a corner non-display area disposed outside the first bending line and outside the second bending line, bent from the second non-display area with respect to the first bending line and bent from the first non-display area with respect to the second bending line. In such an embodiment, a slit is defined in the protective member, and the slit overlaps at least one of a first part of the first bending line, and a first part of the second bending line which define a border of the corner non-display area, a second part of the first bending line extending from the first part of the first bending line, and a second part of the second bending line extending from the first part of the second bending line.

In an embodiment, the circuit layer may further include: a driving circuit disposed in the second non-display area, where the driving circuit provides a driving signal to the pixel circuit; and a connection signal line connected to the driving circuit, and disposed to overlap the first non-display area, the second non-display area and the corner non-display area.

In an embodiment, the display device may further include a flexible printed circuit board coupled to the first non-display area, and electrically connected to the connection signal line.

In an embodiment, the protective member may include: a first protective member disposed on a first surface of the display panel; and a second protective member disposed on a second surface of the display panel facing the first surface.

In an embodiment, the slit may include at least one of: a first slit defined to overlap the first part of the first bending line of the first protective member; and a second slit defined to overlap the second part of the first bending line of the first protective member.

In an embodiment, the first protective member may include a plurality of base films, and the first slit may be defined through a part of the plurality of base films.

In an embodiment, the slit may further include at least one of: a third slit defined to overlap the first part of the first bending line of the second protective member; and a fourth slit defined to overlap the second part of the first bending line of the second protective member.

In an embodiment, the first slit and the second slit may be continuously connected to each other.

In an embodiment, a length of the first slit and a length of the second slit may be substantially equal to each other.

In an embodiment, a width of the first slit may be equal to or less than a width of the third slit, a width of the second slit may be equal to or greater than a width of the fourth slit, and the width of the third slit may be equal to or less than the width of the fourth slit.

In an embodiment, the display element layer may include an organic light-emitting diode connected to the pixel circuit.

An embodiment of the invention provides a display device including a display panel, and a protective member disposed outside the display panel. In such an embodiment, the display panel includes: a display area in which a pixel is disposed; and a non-display area which is adjacent to a periphery of the display area, and in which a signal line is disposed, and a first bending line, a second bending line crossing the first bending line, and a third bending line crossing the first bending line and the second bending line at a single point are defined. In such an embodiment, the non-display area includes: a first non-display area disposed outside the first bending line, and inside the second bending line, bent outwards from the display area with respect to the first bending line, and bent inwards with respect to the third bending line; a second non-display area disposed outside the second bending line, and inside the first bending line, bent outwards from the display area with respect to the second bending line, and bent inwards with respect to the third bending line; and a corner non-display area disposed outside the first bending line, and outside the second bending line, bent outwards from the second non-display area with respect to the first bending line, and bent outwards from the first non-display area with respect to the second bending line.

In an embodiment, the first non-display area may be bent outwards with a first radius of curvature, and bent inwards with a second radius of curvature greater than the first radius of curvature.

In an embodiment, the corner non-display area may be bent outwards with a third radius of curvature substantially equal to the first radius of curvature.

In an embodiment, a first opening is defined in the display panel to overlapping the corner non-display area.

In an embodiment, an edge of the first opening may overlap the third bending line.

In an embodiment, an edge of the first opening may overlap the first bending line and the second bending line.

In an embodiment, a single point may be defined inside the first opening.

In an embodiment, a second opening corresponding to the first opening may be defined in the protective member.

In an embodiment, the signal line may include a connection signal line overlapping the first non-display area, the second non-display area and the corner non-display area.

In an embodiment, the pixel may include a pixel circuit, and an organic light-emitting diode electrically connected to the pixel circuit.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to describe principles of the invention. In the drawings:

FIG. 5A is a plan view illustrating a display module, in an unfolded state, according to an embodiment of the invention;

FIG. 6A is a plan view illustrating the display module, in a state of being bent one time, according to an embodiment of the invention;

FIG. 7A is a plan view illustrating the display module, in an unfolded state, according to an embodiment of the invention;

FIG. 7B is a plan view illustrating the display module, in a state of being bent one time, according to an embodiment of the invention;

FIGS. 8C and 8D are plan views illustrating the display module, in a bent state, according to an embodiment of the invention;

DETAILED DESCRIPTION

Figure 1:
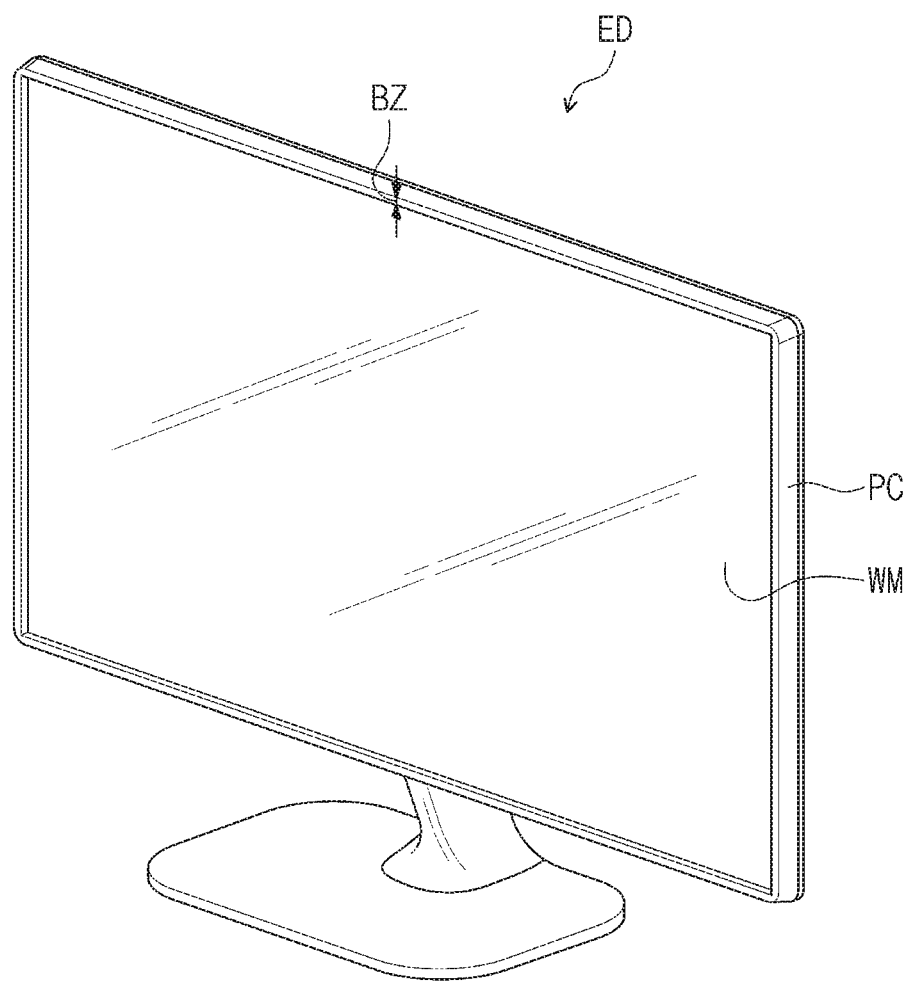
FIG. 1 is a perspective view illustrating an electronic device according to an embodiment of the invention.
Figure 1:
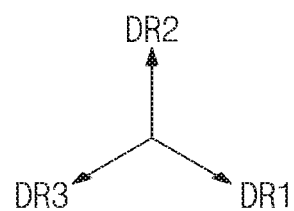

Hereinafter, exemplary embodiments of the invention will be described in more detail with reference to the accompanying drawings. It will be understood that when an element, region, layer, or part is referred to as being "on", "connected to" or "coupled to" another element, region, layer or part, it can be directly on, connected or coupled to the other element, region, layer or part, or intervening elements, regions, layers or parts may be present.

Like reference numerals refer to like elements throughout this specification. The thickness, the ratio and the dimension of the element are exaggerated for effective description of the technical contents. "Or" means "and/or." As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments of the invention will be described in detail with reference to the accompanying drawings.

FIG. 1 is a perspective view illustrating an electronic device ED according to an embodiment of the invention. FIG. 1 illustrates an embodiment where the electronic device ED is a monitor. In such an embodiment, the electronic device ED may be a monitor with a flat display surface, but embodiments of the invention are not limited thereto. In such an embodiment, the electronic device ED may have a curved display surface. An embodiment of the invention may be applied to small electronic devices such as a mobile phone, a tablet computer, a game machine, and a smart watch as well as medium- and large-sized electronic devices such as a laptop computer, and a television.

In an embodiment, the monitor may include a display surface defined by a first direction axis DR1 and a second direction axis DR2. A normal direction to the display surface, that is, the thickness direction of the monitor is indicated by a third direction axis DR3. A front surface (or a top surface) and a rear surface (or a bottom surface) are distinguished by the third direction axis DR3. However, directions indicated by the first to third direction axes DR1 to DR3 are relative concept, and may thus be changed to other directions. Hereinafter, first to third directions are directions respectively indicated by the first to third direction axes DR1 to DR3, and the like reference numerals refer thereto.

The electronic device ED may include a window WM and a protective cover PC. The electronic device ED further includes a display device, an electronic module and the like, which are disposed inside the protective cover PC. The window WM may be coupled to the display device accommodated inside the protective cover PC. The window WM may provide a display surface.

The window WM may be a glass substrate or a plastic substrate. The protective cover PC may be a plastic assembly, a metal assembly, or a plastic-metal assembly. The protective cover PC may include a plurality of parts coupled to each other. A portion of the protective cover PC may be disposed on a front surface of the monitor to define a bezel BZ of the monitor. In an alternative embodiment, the bezel BZ may be defined, though not by the protective cover PC, along an edge region of the window WM. In such an embodiment, color layers disposed along the edge region of the window WM may define the bezel BZ. The bezel BZ is a region, on the front surface of the monitor, on which an image is not displayed. The bezel BZ is defined in the edge region of the window WM so that a non-display area NDA of the display device to be described later is not viewed from the outside.

Figure 2:
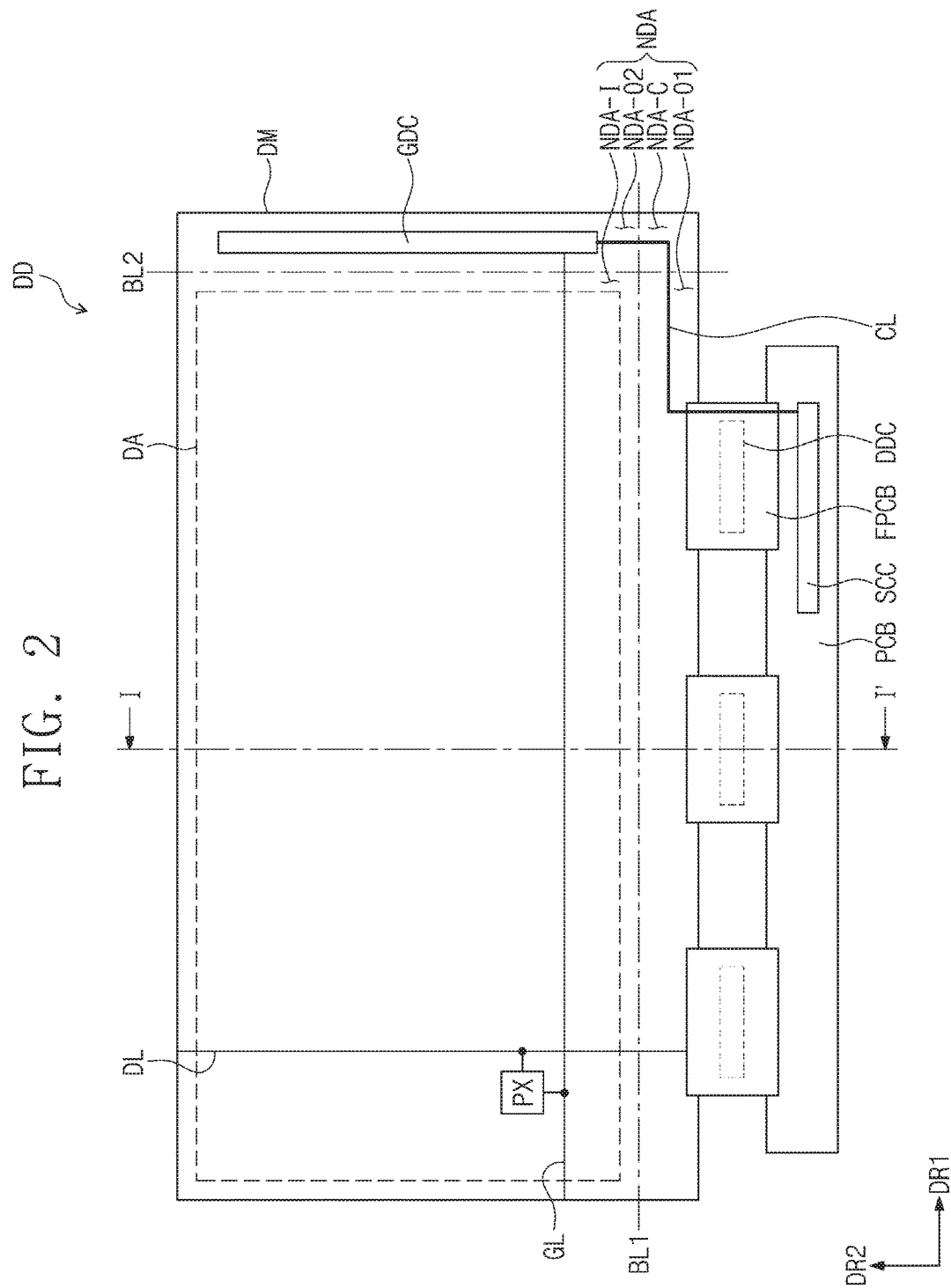
FIG. 2 is a plan view illustrating a display device, in an unfolded state, according to an embodiment of the invention.
Figure 3:
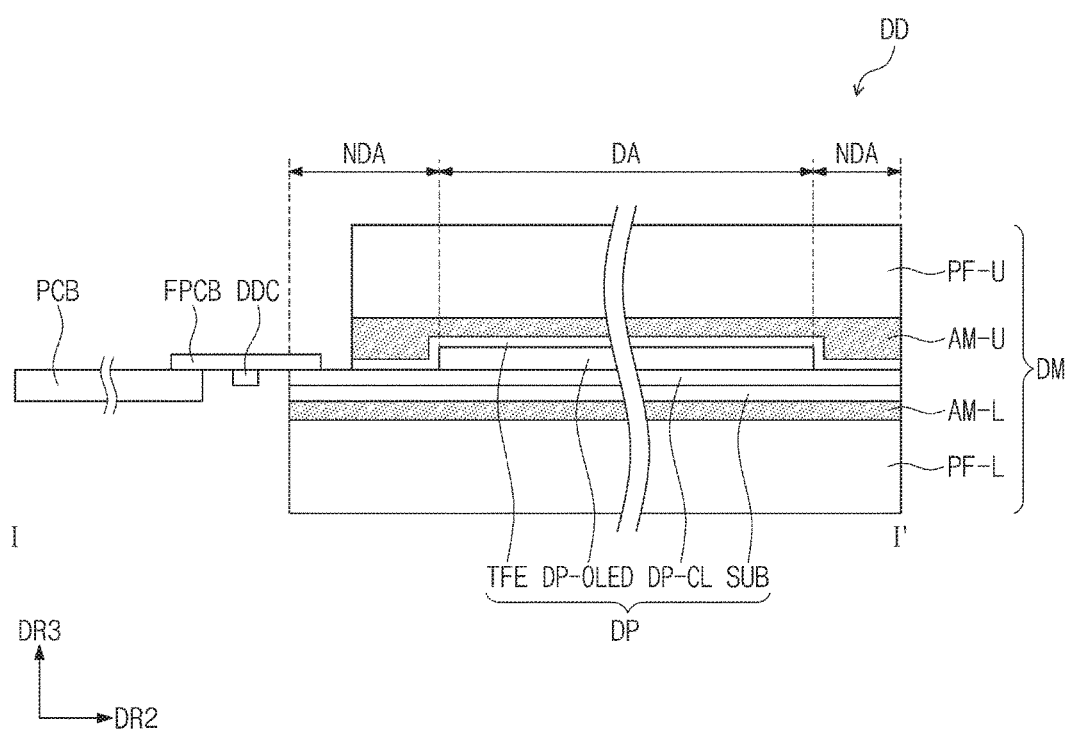
FIG. 3 is a cross-sectional view illustrating the display device according to an embodiment of the invention.
Figure 4:
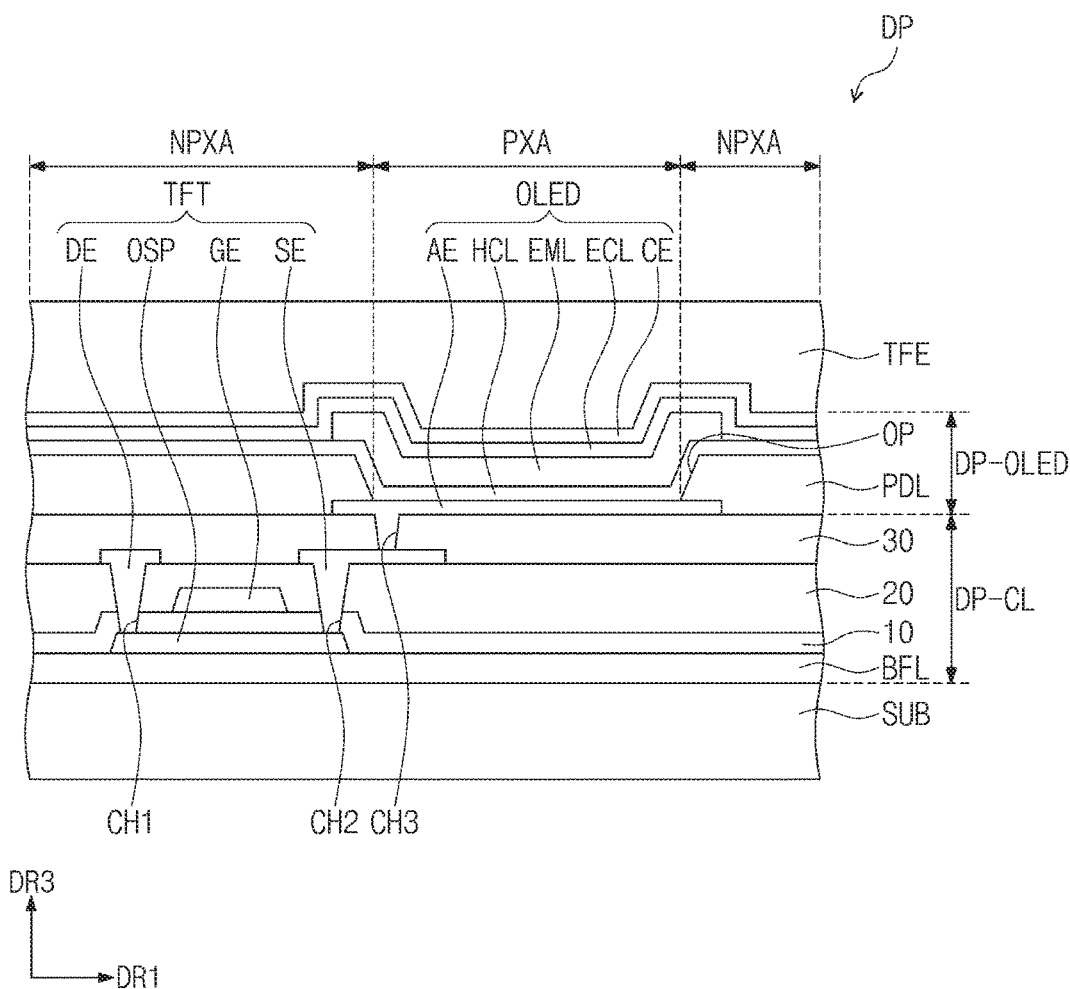
FIG. 4 is a cross-sectional view illustrating a portion of a display panel according to an embodiment of the invention.

FIG. 2 is a plan view illustrating a display device DD, in an unfolded state, according to an embodiment of the invention. FIG. 3 is a cross-sectional view illustrating the display device DD according to an embodiment of the invention. FIG. 4 is a cross-sectional view illustrating a portion of a display panel DP according to an embodiment of the invention.

In an embodiment, as illustrated in FIGS. 2 and 3, the display device DD includes a display module DM. The display module DM includes the display panel DP and a protective member PF-U and PF-L. The protective member PF-U and PF-L may be provided in plurality. The protective member PF-U and PF-L may include a first protective member PF-U disposed on a first surface of the display panel DP and a second protective member PF-L disposed on a second surface of the display panel DP. The first protective member PF-U and the second protective member PF-L face each other in the third direction DR3 with the display panel DP therebetween. In an embodiment, the display panel DP may display an image on the first surface.

The first protective member PF-U and the display panel DP may be coupled via a first adhesive member AM-U, and the second protective member PF-L and the display panel DP may be coupled via a second adhesive member AM-L. The protective member PF-U and PF-L may include a plastic film containing any one selected from the group consisting of polyethersulfone ("PES"), polyacrylate, polyetherimide ("PEI"), polyethylenenaphthalate ("PEN"), polyethyleneterephthalate ("PET"), polyphenylene sulfide ("PPS"), polyarylate, polyimide ("PI"), polycarbonate ("PC"), poly (arylene ethersulfone), and a combination thereof. A material constituting the protective member PF-U and PF-L is not limited to plastic resins, but may include an organic/inorganic composite material. The protective member PF-U and PF-L may include a porous organic layer, and an inorganic material filled in pores of the organic layer. The protective member PF-U and PF-L may have a single layer or multi-layer structure.

Each of the first adhesive member AM-U and the second adhesive member AM-L may be an optically clear adhesive film ("OCA"), an optically clear resin ("OCR"), a pressure sensitive adhesive film ("PSA"), or the like. Each of the first adhesive member AM-U and the second adhesive member AM-L includes a photo-curable adhesive material, or a heat-curable adhesive material, but a raw material thereof is not particularly limited.

The display device DD may further include electronic components PCB and FPCB connected to the display module DM. The electronic components PCB and FPCB may include a flexible printed circuit board FPCB connected to the display module DM, and a main printed circuit board PCB connected to the flexible printed circuit board FPCB. In an embodiment, a driving circuit for driving the display module DM (for example, a data driving circuit DDC), may be mounted on the flexible printed circuit board FPCB. In an embodiment, a signal control circuit SCC may be mounted on the main printed circuit board PCB. The signal control circuit SCC may include a timing controller.

In an embodiment, as illustrated in FIG. 2, the display module DM includes a display area DA, and the non-display area NDA when viewed in a plane or viewed from a top plan view. The non-display area NDA is an area disposed in a periphery of the display area DA. An image is displayed on the display area DA, and the image is not displayed on the non-display area NDA. The non-display area NDA is an area disposed in the periphery of the display area DA.

In the non-display area NDA, a plurality of bending lines may be defined. A bending line is a reference line at which the display module DM is bent. The plurality of bending lines may include a first bending line BL1 and a second bending line BL2 crossing each other. The first bending line BL1 may be parallel to the first direction axis DR1, and the second bending line BL2 may be parallel to the second direction axis DR2. The first bending line BL1 and the second bending line BL2 may be perpendicular to each other.

The non-display area NDA may include a plurality of non-display areas divided by the bending line. The non-display area NDA includes a first non-display area NDA-O1, a second non-display area NDA-O2, and a corner non-display area NDA-C. The non-display area NDA may further include a peripheral non-display area NDA-I. However, the peripheral non-display area NDA-I may be omitted in an embodiment where the first bending line BL1 and the second bending line BL2 form a boundary line between the display area DA and the non-display area NDA.

In such an embodiment, the non-display area NDA may include a single corner non-display area NDA-C, for example, but not being limited thereto. Alternatively, more than one corner non-display area NDA-C may be defined. In one embodiment, for example, four corner non-display areas NDA-C may be defined. Third and fourth non-display areas may be further defined to respectively face the first non-display area NDA-O1, and the second non-display area NDA-O2. Accordingly, non-display areas may be bent to cover the four edges of the display area DA.

The first non-display area NDA-O1 is disposed outside the first bending line BL1, and inside the second bending line BL2. As described below, the first non-display area NDA-O1 is bent from the display area DA with respect to the first bending line BL1. Herein, an area "outside the bending line" is defined as an area in which a pixel PX is not disposed, and an area "inside the bending line" is defined as an area in which the pixel PX is disposed.

The second non-display area NDA-O2 is disposed outside the second bending line BL2, and inside the first bending line BL1. The second non-display area NDA-O2 is bent from the display area DA with respect to the second bending line BL2. The corner non-display area NDA-C is disposed outside the second bending line BL2, and outside the first bending line BL1. The corner non-display area NDA-C is bent from the second non-display area NDA-O2 with respect to the first bending line BL1, and bent from the first non-display area NDA-O1 with respect to the second bending line BL2.

The flexible printed circuit board FPCB may be coupled to the first non-display area NDA-O1, and a driving circuit (for example, a gate driving circuit GDC) may be disposed in the second non-display area NDA-O2. In an embodiment, a gate driving circuit GDC (e.g., a single driving circuit GDC as shown in FIG. 2) may be disposed in a second non-display area NDA-O2, but not being limited thereto. Alternatively, another gate driving circuit GDC may be disposed in another non-display area to face the gate driving circuit GDC in the first direction DR1.

Signal lines may be disposed in the display area DA and the non-display area NDA. The signal lines may include data lines DL and gate lines GL. The data lines DL and the gate lines GL may overlap both the display area DA and the non-display area NDA. In FIG. 2, one pixel PX, one data line DL, and one gate line GL are illustrated for convenience of illustration, but not being limited thereto.

The pixel PX is disposed in the display area DA. The pixel PX includes a pixel circuit and a display element. The data line DL and the gate line GL respectively supply a data signal and a gate signal to the pixel PX. The pixel circuit may supply a signal corresponding to the data signal to the display element in response to the gate signal.

The signal lines include a connection signal line CL disposed in the non-display area NDA. The connection signal line CL may overlap the first non-display area NDA-O1, the second non-display area NDA-O2 and the corner non-display area NDA-C. The connection signal line CL may connect the gate driving circuit GDC to the flexible printed circuit board FPCB. In an alternative embodiment, the signal lines may further include another signal line (not shown) overlapping both the display area DA and the non-display area NDA.

In an embodiment, as illustrated in FIG. 3, the display panel DP includes a base layer SUB. The display panel DP further includes a circuit layer DP-CL, a display element layer DP-OLED, and a thin-film encapsulation layer TFE, which are disposed on the base layer SUB. In an embodiment, the display panel DP and the protective member PF-U and PF-L may be divided into the display area DA and the non-display area NDA. In one embodiment, for example, the circuit layer DP-CL may include the display area DA, the first non-display area NDA-O1, the second non-display area NDA-O2, and the corner non-display area NDA-C.

The base layer SUB may include a plastic film. The base layer SUB is a flexible substrate. In an embodiment, the base layer SUB may include a plastic substrate, a glass substrate, a metal substrate, an organic/inorganic composite material substrate, or the like.

The circuit layer DP-CL may include an intermediate insulation layer, a plurality of conductive layers, and a semiconductor layer. The plurality of conductive layers of the circuit layer DP-CL may constitute or define the signal lines, or the pixel circuit. The display element layer DP-OLED includes a display element, for example, organic light-emitting diodes. The thin-film encapsulation layer TFE seals the display element layer DP-OLED.

In an embodiment, the display module DM may further include a touch sensing unit (not shown) that obtains position information of an external input on a touch surface or coordinate information about the external input. In an embodiment, the display module DM may further include an anti-reflective layer. The anti-reflective layer may include a color filter, or a laminated structure having a conductive layer, an insulation layer and a conductive layer. The anti-reflective layer may reduce reflectance of external light by absorbing, destructively interfering, or polarizing the light incident from the outside. The anti-reflective layer may include an optical member such as a polarizing plate.

The touch sensing unit and the anti-reflective layer may be disposed between the first protective member PF-U and the display panel DP. The optical member may constitute a part of the first protective member PF-U.

FIG. 4 illustrates a cross section of a portion of the display panel DP corresponding to a part of the pixel PX (see FIG. 2.). The pixel PX may include a transistor TFT as the pixel circuit, and an organic light-emitting diode OLED as the display element.

A buffer layer BFL may be disposed on the base layer SUB. The buffer layer BFL improves bonding force between the base layer SUB, and conductive patterns or semiconductor patterns to be disposed thereon. The buffer layer BFL may include an inorganic layer. In an embodiment, a barrier layer (not shown), which prevents foreign matter from being introduced, may further be disposed on a top surface of the base layer SUB. The buffer layer BFL and the barrier layer may be optionally provided or omitted.

A semiconductor pattern OSP of the transistor TFT is disposed on the buffer layer BFL. A first insulation layer 10 may be disposed on the buffer layer BFL to cover the semiconductor pattern OSP. The first insulation layer 10 may include a plurality of inorganic layers. A control electrode GE of the transistor TFT is disposed on the first insulation layer 10. The control electrode GE may be obtained through the same photolithography process as that for the gate line GL (see FIG. 2.).

A second insulation layer 20 may be disposed on the first insulation layer 10 to cover the control electrode GE. The second insulation layer 20 may provide a flat top surface. The second insulation layer 20 may include an organic material and/or an inorganic material.

An input electrode DE and an output electrode SE of the transistor TFT are disposed on the second insulation layer 20. The input electrode DE may be provided through a same photolithography process as the data line DL (see FIG. 2.).

The input electrode DE and the output electrode SE are connected to the semiconductor pattern OSP through a first through hole CH1 and a second through hole CH2, which are defined through the first insulation layer 10 and the second insulation layer 20. In an alternative embodiment of the invention, the structure of the transistor TFT may be modified into a bottom gate structure.

A third insulation layer 30 is disposed on the second insulation layer 20 to cover the input electrode DE and the output electrode SE. The third insulation layer 30 includes an organic layer and/or an inorganic layer. In an embodiment, the third insulation layer 30 may include an organic material to provide a flat surface.

A pixel defining film PDL and the organic light-emitting diode OLED are disposed on the third insulation layer 30. A first electrode AE of the organic light-emitting diode OLED is disposed on the third insulation layer 30. The first electrode AE is connected to the output electrode SE through a third through hole CH3 defined through the third insulation layer 30. An opening OP is defined in the pixel defining film PDL. The opening OP of the pixel defining film PDL exposes at least a portion of the first electrode AE.

The pixel PX may be disposed in a pixel area when viewed in a plane or viewed from a top plan view. The pixel area may include a light-emitting area PXA, and a non-light-emitting area NPXA adjacent to the light-emitting area PXA. The non-light-emitting area NPXA may enclose the light-emitting area PXA. In an embodiment, the light-emitting area PXA is defined to correspond to the one portion of the first electrode AE exposed by the opening OP.

A hole control layer HCL of the organic light-emitting diode OLED may be disposed in both the light-emitting area PXA and the non-light-emitting area NPXA. In an embodiment, a common layer such as the hole control layer HCL may be further provided in the display area DA (see FIG. 2.) as well. A light-emitting layer EML of the organic light-emitting diode OLED is disposed on the hole control layer HCL. The light-emitting layer EML may be disposed in an area corresponding to the opening OP. An electron control layer ECL of the organic light-emitting diode OLED is disposed on the light-emitting layer EML. In an embodiment, the electron control layer ECL may be further provided in the display area DA (see FIG. 2.). A second electrode CE of the organic light-emitting diode OLED is disposed on the electron control layer ECL. The second electrode CE may be further provided in the display area DA.

The thin-film encapsulation layer TFE is disposed on the second electrode CE. The thin-film encapsulation layer TFE includes an inorganic layer and an organic layer. The thin-film encapsulation layer TFE may include at least two inorganic layers and the organic layer disposed therebetween. The inorganic layers protect the display element layer DP-OLED against moisture and/or oxygen, and the organic layer protects the display element layer DP-OLED against foreign matter such as dust particles. The inorganic layer may include a silicon nitride layer, a silicon oxy-nitride layer and silicon oxide layer, a titanium oxide layer, aluminum oxide layer, or the like. The organic layer may include an acrylic-based organic layer, and is not limited thereto. Other layers may further be disposed on the thin-film encapsulation layer TFE.

In an embodiment, the gate driving circuit GDC illustrated in FIG. 2 may include a plurality of transistors formed by a same process as the transistor TFT of the pixel PX described above. Some of the plurality of transistors of the gate driving circuit GDC may have a same structure as the transistor TFT of the pixel PX. The gate driving circuit GDC further includes a signal line disposed in or directly on a same layer as the gate line GL and the data line DL. The connection signal line CL illustrated in FIG. 2 may be disposed in or directly on a same layer as the gate line GL or the data line DL.

Figure 5B:
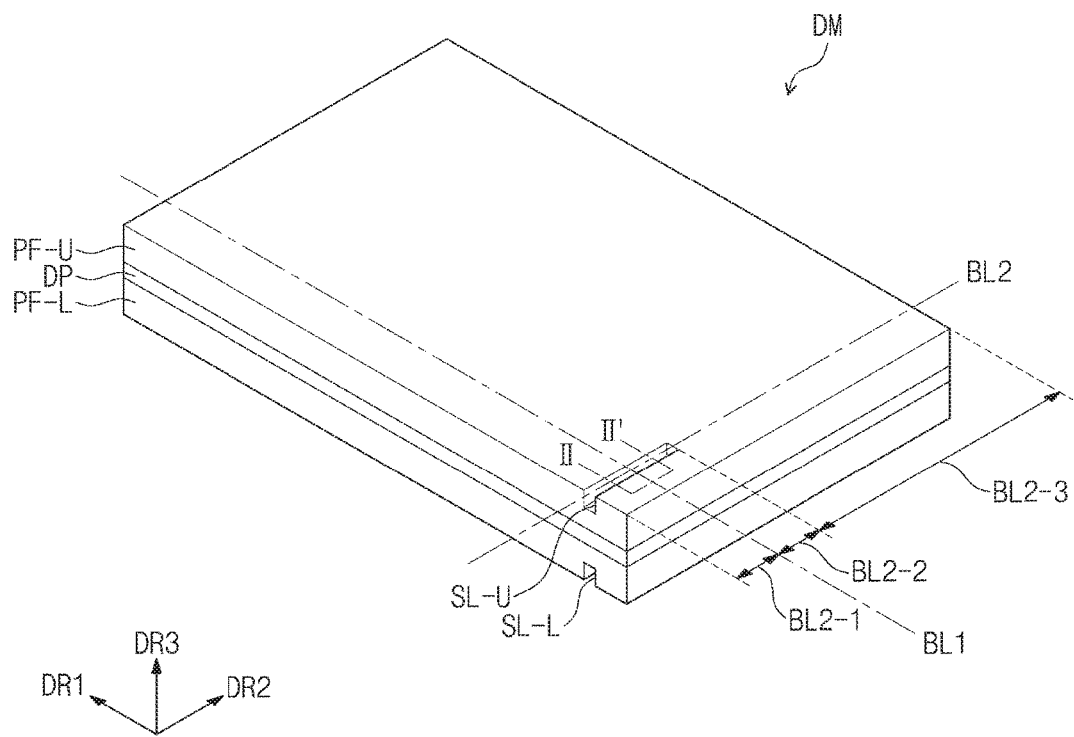
FIG. 5B is a perspective view illustrating the display module, in an unfolded state, according to an embodiment of the invention.
Figure 5C:
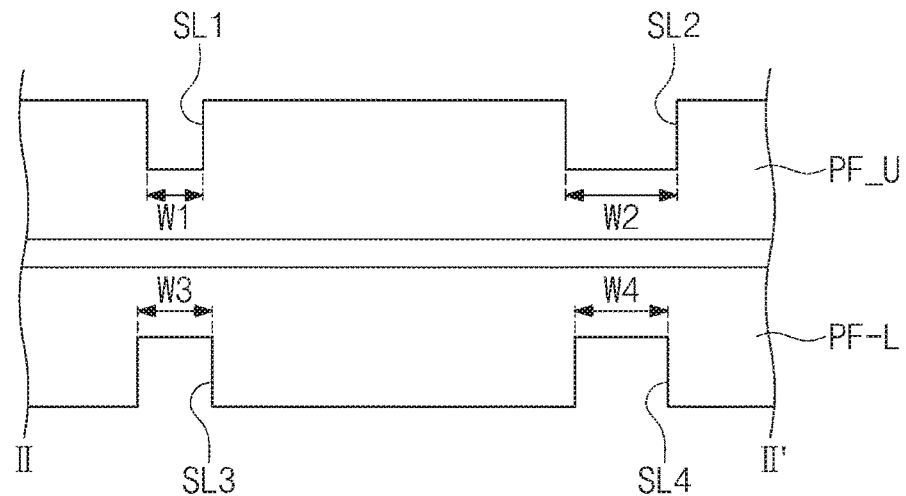
FIGS. 5C and 5D are cross-sectional views illustrating the display module according to an embodiment of the invention.
Figure 5D:
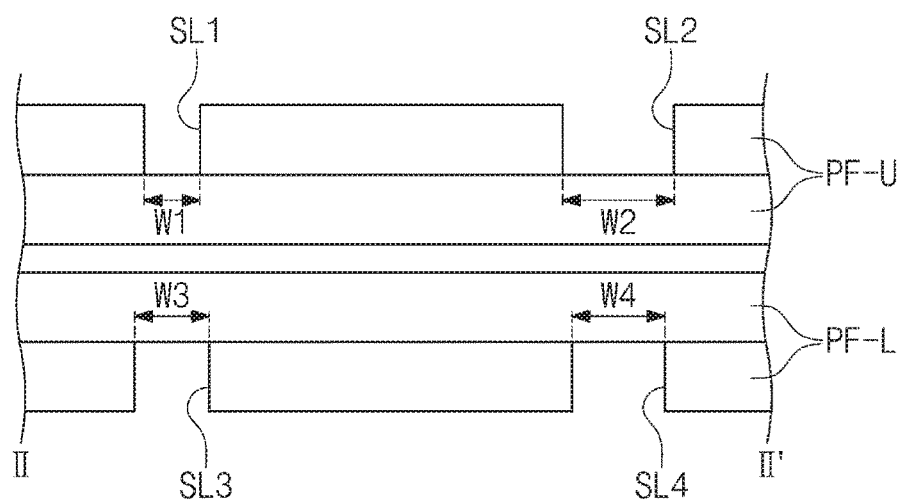

FIG. 5A is a plan view illustrating the display module DM, in an unfolded state, according to an embodiment of the invention. FIG. 5B is a perspective view illustrating the display module DM, in an unfolded state, according to an embodiment of the invention. FIGS. 5C and 5D are cross-sectional views illustrating the display module DM according to an embodiment of the invention. In FIGS. 5A to 5D, for convenience of illustration, the first adhesive member AM-U and the second adhesive member AM-L are not illustrated, and the display panel DP is illustrated as a single layer.

In an embodiment, as illustrated in FIGS. 5A and 5B, a slit SL-U and SL-L is defined in a portion of the protective member PF-U and PF-L. The slit SL-U and SL-L may be partially recessed in or fully passes through the protective member PF-U and PF-L in the thickness direction DR3 thereof.

The slit SL-U and SL-L may overlap a part of the first bending line BL1, or a part of the second bending line BL2. In an embodiment, as shown in FIG. 5B, slits may be respectively defined in the first protective member PF-U and the second protective member PF-L, and may include a first member slit SL-U defined in the first protective member PF-U and a second member slit SL-L defined in the second protective member PF-L. The first member slit SL-U and the second member slit SL-L overlap the part of the second bending line BL2. In an embodiment of the invention, one of the first member slit SL-U and the second member slit SL-L may be omitted.

The second bending line BL2 defined within the display module DM may be divided into a portion BL2-1 (hereinafter, referred to as "first portion") defining a border of the corner non-display area NDA-C, and a portion defining a border of the second non-display area NDA-O2. The first member slit SL-U and the second member slit SL-L may overlap the first portion BL2-1 of the second bending line BL2, or overlap a portion BL2-2 (hereinafter, referred to as "second portion") of the second bending line BL2, defining a portion of the border of the second non-display area NDA-O2. The second portion BL2-2 of the second bending line BL2 may extend from the first portion BL2-1 of the second bending line BL2. The first member slit SL-U and the second member slit SL-L may overlap both the first portion BL2-1 of the second bending line BL2, and the second portion BL2-2 of the second bending line BL2.

The first member slit SL-U and the second member slit SL-L may not overlap the remaining portion BL2-3 (hereinafter, referred to as "third portion") of the second bending line BL2. The second portion BL2-2 of the second bending line BL2 and the first portion BL2-1 of the second bending line BL2 may have a same length as each other in the second direction DR2.

Each of the first member slit SL-U and the second member slit SL-L may have a constant width, or different widths depending on a region. The width is defined as a length in the first direction DR1.

In an embodiment, as illustrated in FIG. 5C, the first member slit SL-U may include a first slit SL1 and a second slit SL2 having widths different from each other. A first width W1 of the first slit SL1 may be smaller than a second width W2 of the second slit SL2. The first slit SL1 corresponds to the first portion BL2-1 of the second bending line BL2, and the second slit SL2 corresponds to the second portion BL2-2 of the second bending line BL2.

The second member slit SL-L may include a third slit SL3 and a fourth slit SL4 having widths different from each other. A third width W3 of the third slit SL3 may be smaller than a fourth width W4 of the fourth slit SL4. The third slit SL3 corresponds to the first portion BL2-1 of the second bending line BL2, and the fourth slit SL4 corresponds to the second portion BL2-2 of the second bending line BL2. The first slit SL1 overlaps the third slit SL3, and the second slit SL2 overlaps the fourth slit SL4.

In an embodiment, the first width W1 of the first slit SL1 may be equal to or less than the third width W3 of the third slit SL3. In an embodiment, the second width W2 of the second slit SL2 may be equal to or greater than the fourth width W4 of the fourth slit SL4. In an embodiment, the first width W1 of the first slit SL1 may be equal to or less than a second width W2 of the second slit SL2. In an embodiment, the third width W3 of the third slit SL3 may be equal to or less than the fourth width W4 of the fourth slit SL4.

In an alternative embodiment, as illustrated in FIG. 5D, the protective member PF-U and PF-L may include a plurality of base films. The plurality of base films may be coupled to each other via an adhesive, or coupled without the adhesive depending on a molding method.

The first slit SL1 and the second slit SL2 pass through some of the plurality of base films of the first protective member PF-U. In an embodiment, as illustrated in FIG. 5D, the first protective member PF-U may include two base films, and the first slit SL1 and the second slit SL2 may pass through an upper base film of the two base films. The third slit SL3 and the fourth slit SL4 may also pass through a part of the plurality of base films of the second protective member PF-L. In an embodiment, as illustrated in FIG. 5D, the second protective member PF-L may include two base films, and the third slit SL3 and the fourth slit SL4 may pass through a lower base film of the two base films.

Figure 6B:
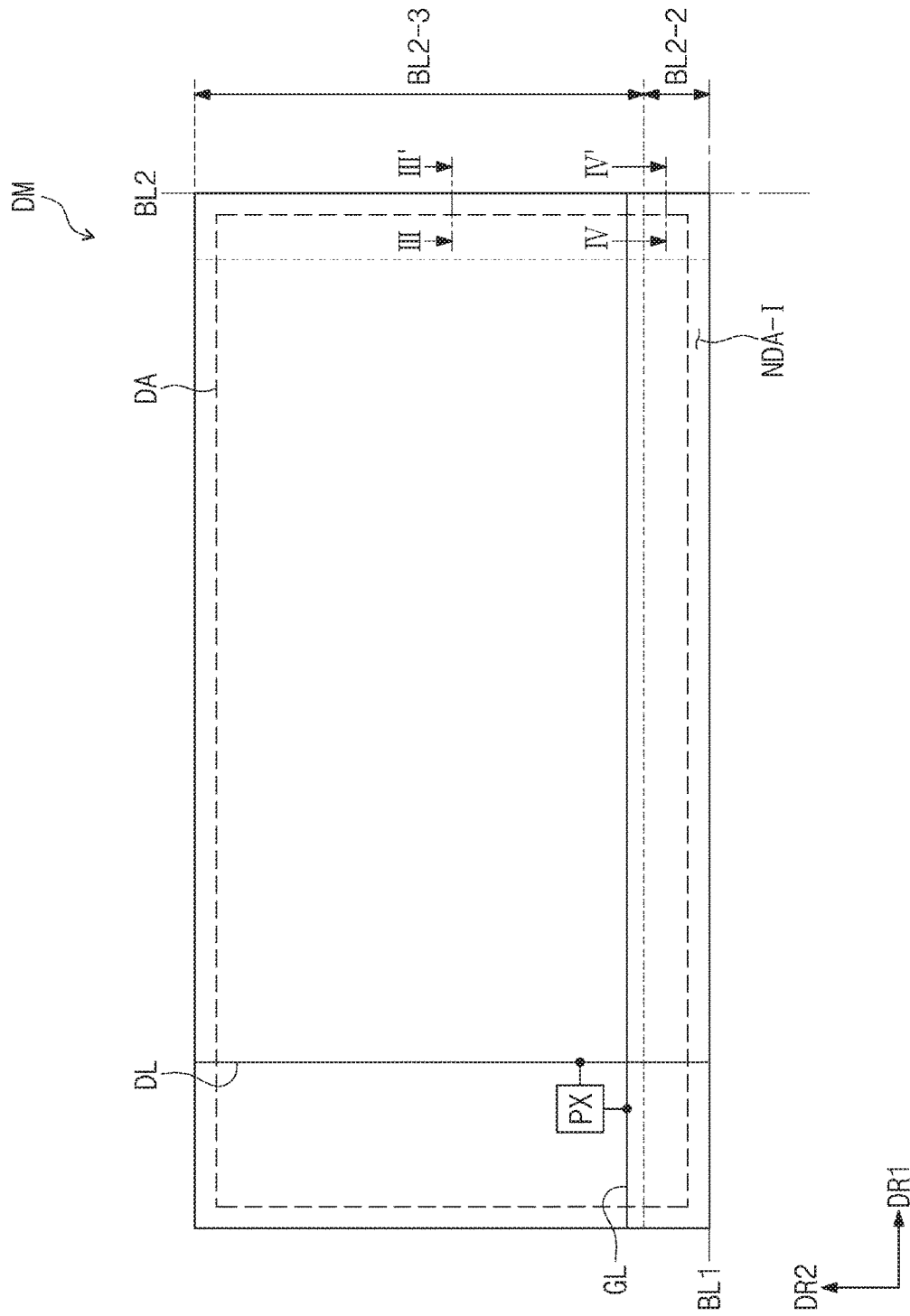
FIG. 6B is a plan view illustrating the display module, in a state of being bent two times, according to an embodiment of the invention.
Figure 6C:
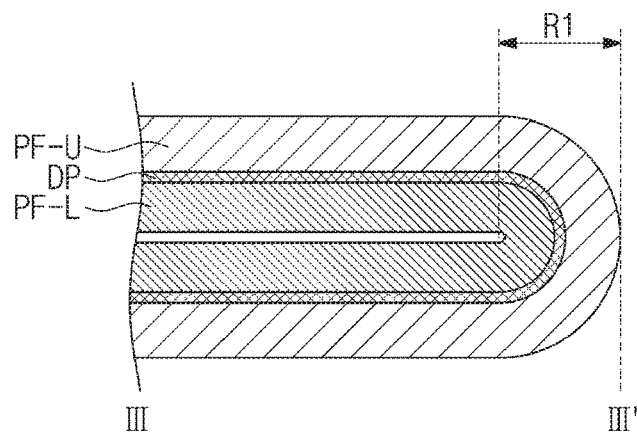
FIGS. 6C and 6D are partial cross-sectional views illustrating the display module, in a state of being bent two times, according to an embodiment of the invention.
Figure 6D:
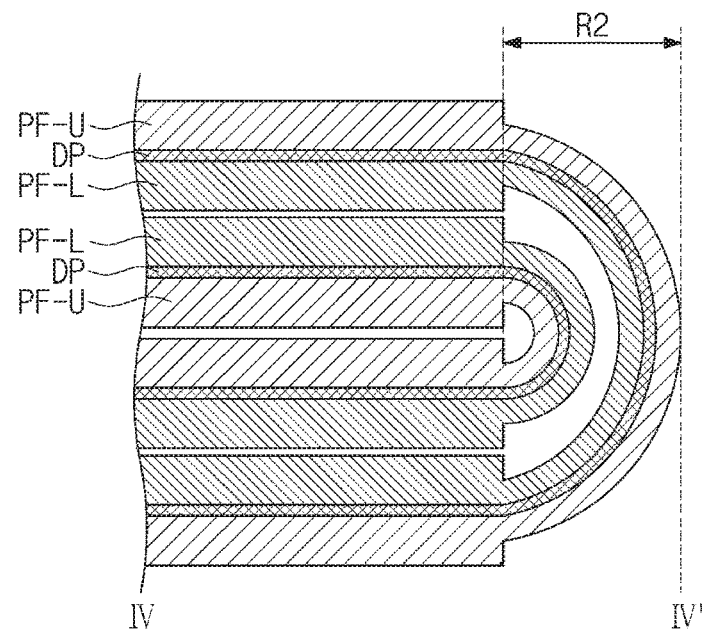

FIG. 6A is a plan view illustrating the display module DM, in a state of being bent one time, according to an embodiment of the invention. FIG. 6B is a plan view illustrating the display module DM, in a state of being bent two times, according to an embodiment of the invention. FIGS. 6C and 6D are partial cross-sectional views illustrating the display module DM, in a state of being bent two times, according to an embodiment of the invention. FIGS. 6C and 6D illustrate cross sections of parts different from each other.

In an embodiment, as illustrated in FIG. 6A, the first non-display area NDA-O1 and the corner non-display area NDA-C are bent with respect to the first bending line BL1. The first non-display area NDA-O1 and the corner non-display area NDA-C overlap the display area DA. The first non-display area NDA-O1 and the corner non-display area NDA-C are bent in a way such that portions of the second protective member PF-L different from each other become closer, and portions of the first protective member PF-U different from each other become farther.

In such an embodiment, as illustrated in FIG. 6B, the second non-display area NDA-O2 and the corner non-display area NDA-C are bent with respect to the second bending line BL2. The second non-display area NDA-O2 overlaps the display area DA. The second non-display area NDA-O2 and the corner non-display area NDA-C are bent in a way such that the portions of the second protective member PF-L different from each other become closer, and the portions of the first protective member PF-U different from each other become farther. As illustrated in FIGS. 6A and 6B, a bezel area BZ (see FIG. 1.) may be minimized by bending the non-display area NDA.

In such an embodiment, as shown in FIGS. 6C and 6D, a radius of curvature of the bent portions varies depending on a position. As illustrated in FIG. 6C, an area, in which only the second non-display area NDA-O2 is bent, has a relatively small radius of curvature R1 (hereinafter, referred to as "first radius of curvature"). As illustrated in FIG. 6D, an area, in which the first non-display area NDA-O1, the second non-display area NDA-O2 and the corner non-display area NDA-C overlap, has a relatively large radius of curvature R2 (hereinafter, referred to as "second radius of curvature"). In such an embodiment, the second radius of curvature R2 is smaller than two times the first radius of curvature R1. In such an embodiment the slit SL-U and SL-L described above referring to FIGS. 5A to 5D decreases the second radius of curvature R2, such that a tensile stress or a compressive stress applied to a portion of the display panel DP, e.g., the signal lines in a bent area, may be effectively reduced.

Figure 7C:
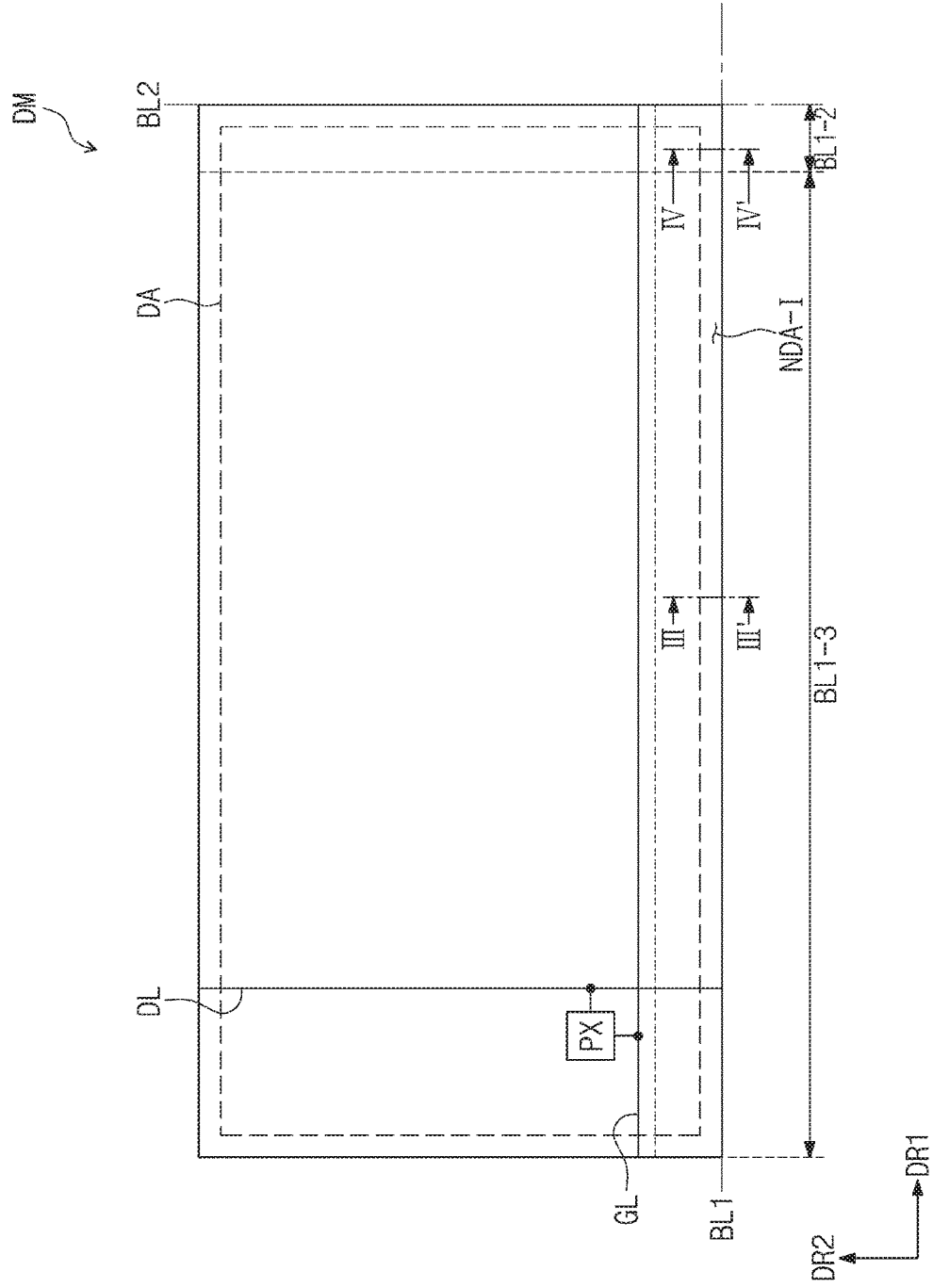
FIG. 7C is a plan view illustrating the display module, in a state of being bent two times, according to an embodiment of the invention.

FIG. 7A is a plan view illustrating the display module DM, in an unfolded state, according to an embodiment of the invention. FIG. 7B is a plan view illustrating the display module DM, in a state of being bent one time, according to an embodiment of the invention. FIG. 7C is a plan view illustrating the display module DM, in a state of being bent two times, according to an embodiment of the invention. Hereinafter, detailed description of the same configuration as in the display module DM described above referring to FIGS. 1 to 6D will be omitted or simplified.

In an embodiment, as illustrated in FIGS. 7A to 7C, the display module DM has a bending sequence different from that of the embodiments of the display module DM described above with reference to FIGS. 6A to 6D. In such an embodiment, the positions of the slits SL-U and SL-L are different. The slit SL-U and SL-L may include any one of the first member slit SL-U and the second member slit SL-L described above referring to FIGS. 5A to 5D. The first member slit SL-U and the second member slit SL-L overlap a part of the first bending line BL1. The first bending line BL1 defined within the display module DM may be divided into a first portion BL1-1, a second portion BL1-2 and a third portion BL1-3 as shown in FIG. 7A. A cross section taken along line II-II' of FIG. 7A may be the same as that illustrated in FIG. 5C or FIG. 5D.

In such an embodiment, as illustrated in FIG. 7B, the second non-display area NDA-O2 and the corner non-display area NDA-C are bent with respect to the second bending line BL2. The second non-display area NDA-O2 and the corner non-display area NDA-C overlap the display area DA. As illustrated in FIG. 7C, the first non-display area NDA-O1 and the corner non-display area NDA-C are bent with respect to the first bending line BL1. The first non-display area NDA-O1 overlaps the display area DA. A cross section taken along line of FIG. 7C may be the same as that illustrated in FIG. 6C, and a cross section taken along line IV-IV' of FIG. 7C may be the same as that illustrated in FIG. 6D.

Figure 8A:
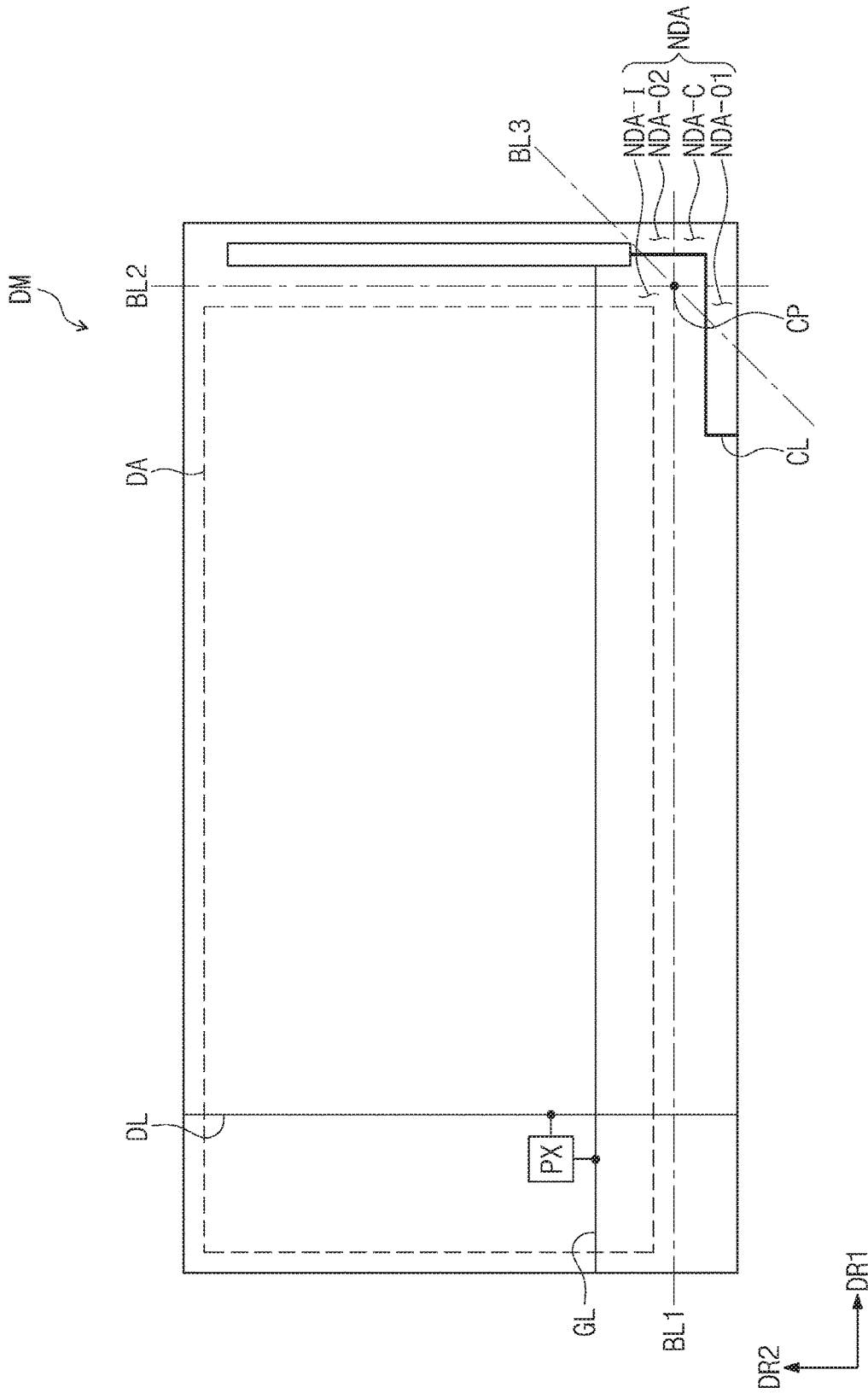
FIG. 8A is a plan view illustrating the display module, in an unfolded state, according to an embodiment of the invention.
Figure 8B:
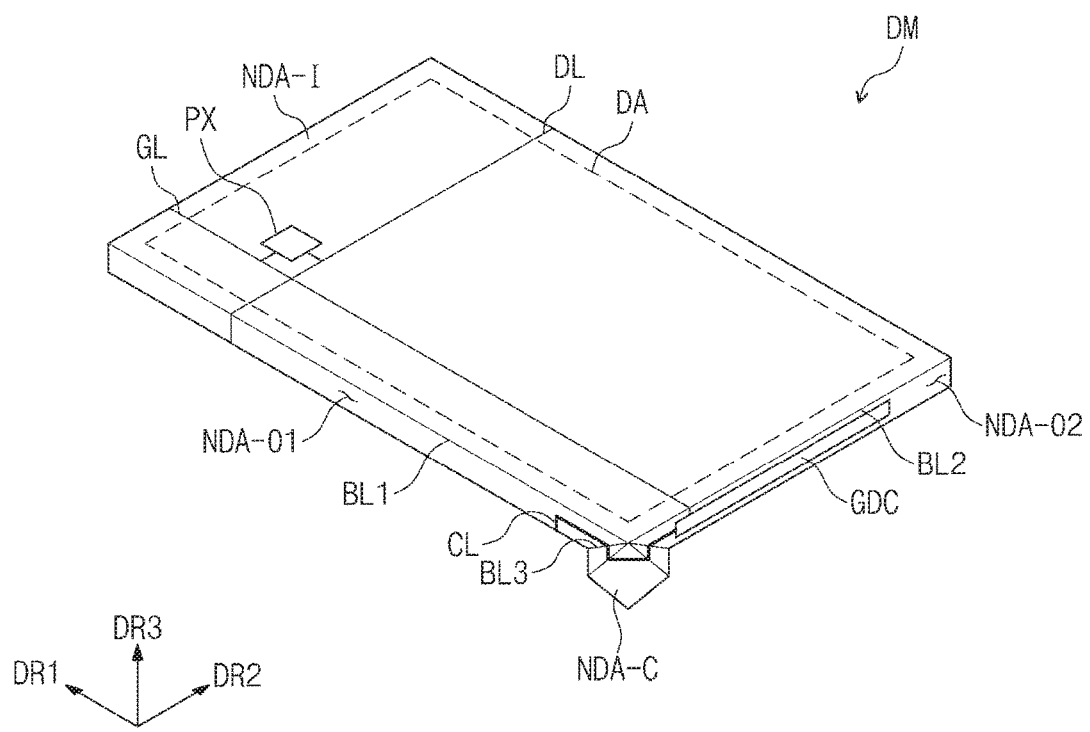
FIG. 8B is a perspective view illustrating a bending operation state of the display module according to an embodiment of the invention.
Figure 8C:
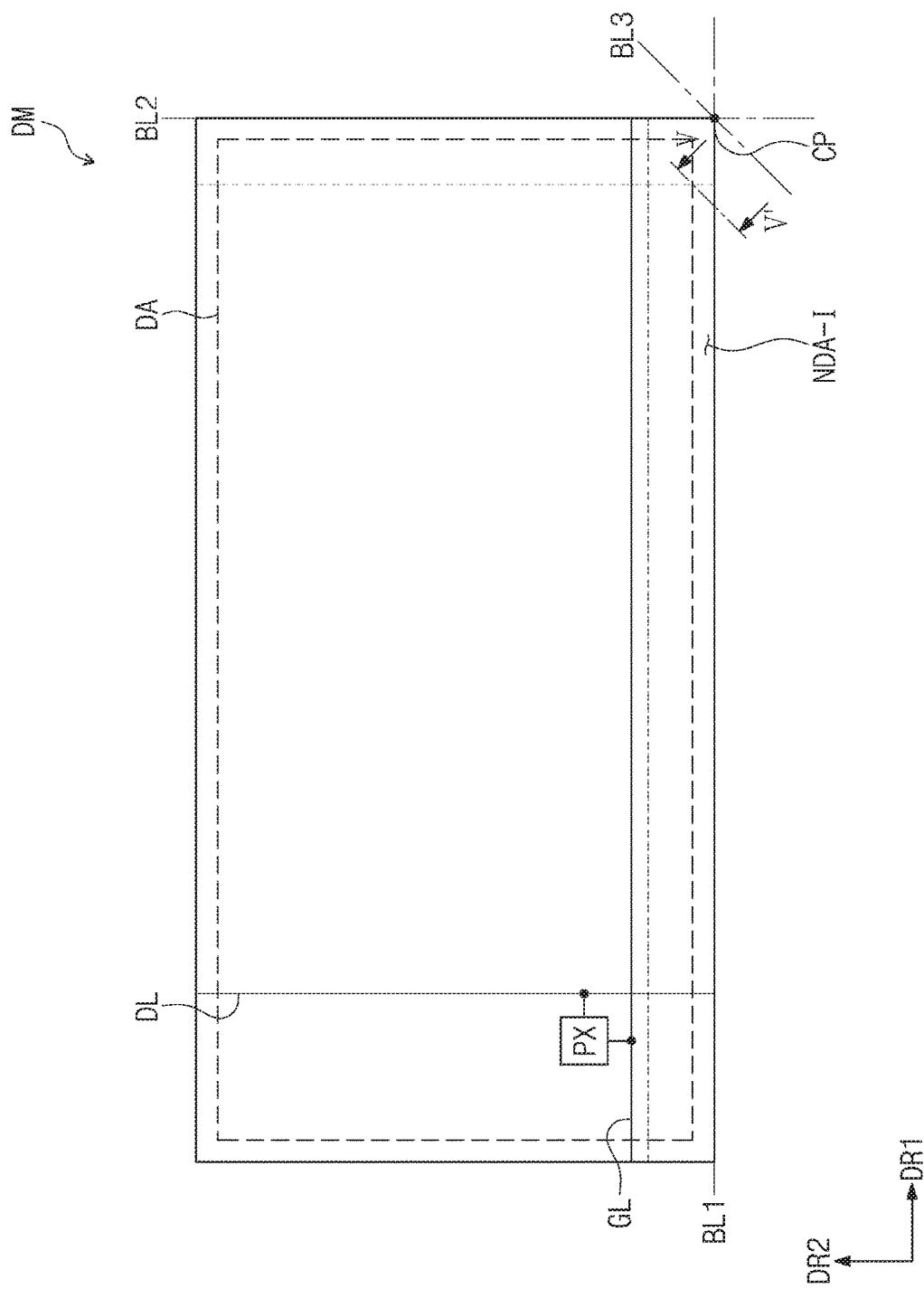
Figure 8E:
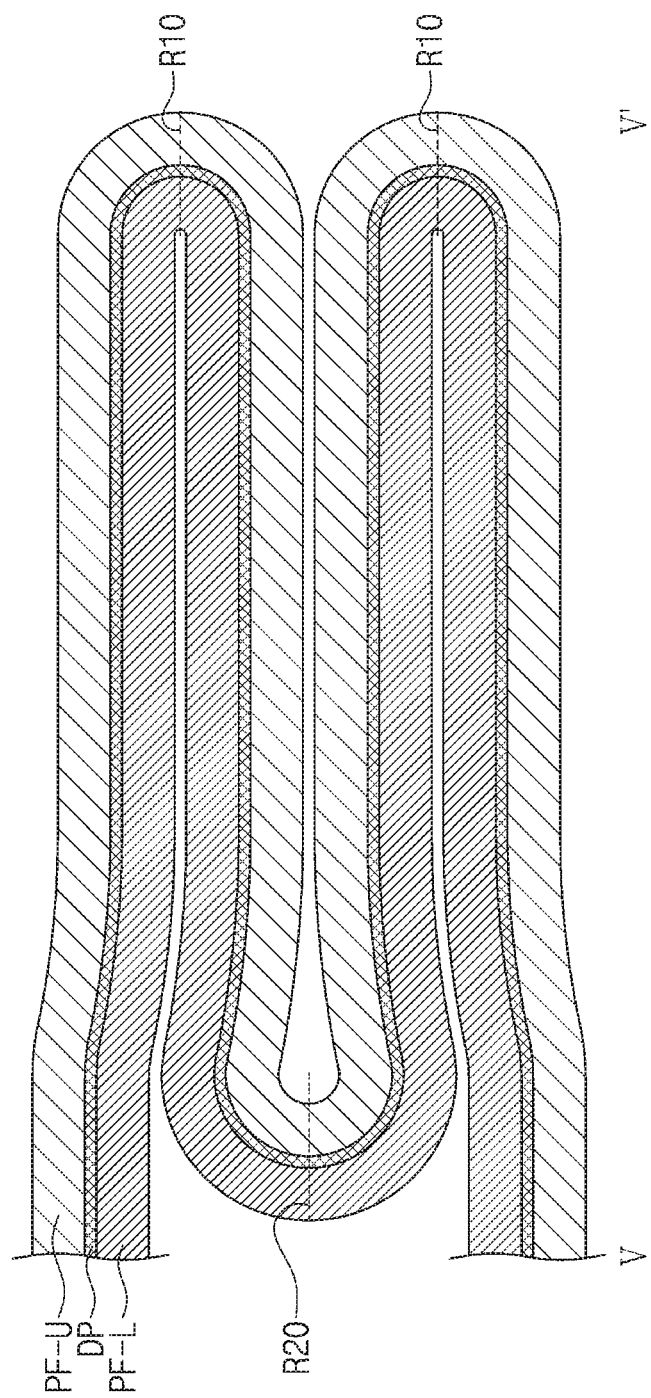
FIG. 8E is a partial cross-sectional view illustrating the display module, in a bent state, according to an embodiment of the invention.

FIG. 8A is a plan view illustrating the display module DM, in an unfolded state, according to an embodiment of the invention. FIG. 8B is a perspective view illustrating a bending operation state of the display module DM according to an embodiment of the invention. FIGS. 8C and 8D are plan views illustrating the display module DM, in a bent state, according to an embodiment of the invention. FIG. 8E is a partial cross-sectional view illustrating the display module DM, in a bent state, according to an embodiment of the invention. Hereinafter, detailed description of the same configuration as in the display module DM described above referring to FIGS. 1 to 7C will be omitted or simplified.

In an embodiment, as illustrated in FIG. 8A, the display module DM includes the display area DA and the non-display area NDA when viewed in a plan view. In such an embodiment, a plurality of bending lines may be defined in the non-display area NDA. In such an embodiment, the display module DM may further include a third bending line BL3, which crosses the first bending line BL1 and the second bending line BL2 and is defined in the non-display area NDA. The first bending line BL1, the second bending line BL2 and the third bending line BL3 cross each other at a single point CP.

The third bending line BL3 is defined to overlap the first non-display area NDA-O1 and the second non-display area NDA-O2. The third bending line BL3 does not overlap the corner non-display area NDA-C.

In such an embodiment, the display module DM may not include the slit SL-U and SL-L defined in the protective member PF-U and PF-L. In such an embodiment, as described below, the display module DM is bent in a way such that a portion having the cross section illustrated in FIG. 6D is not defined.

FIG. 8B illustrates bending operations along the first bending line BL1, the second bending line BL2 and the third bending line BL3. The first non-display area NDA-O1 is bent outwards from the display area DA with respect to the first bending line BL1, and bent inwards with respect to the third bending line BL3. The second non-display area NDA-O2 is bent outwards from the display area DA with respect to the second bending line BL2, and bent inwards with respect to the third bending line BL3. The corner non-display area NDA-C is bent outwards from the second non-display area NDA-O2 with respect to the first bending line BL1, and bent outwards from the first non-display area NDA-O1 with respect to the second bending line BL2.

Inward bending and outward bending indicate directions different from each other among two bendable directions. Herein, the term "outward bending" may be defined to bend the display module such that the portions of the second protective member PF-L (see FIG. 5B.) different from each other become closer, and the portions of the first protective member PF-U (see FIG. 5B.) different from each other become farther. Herein, the term "inward bending" may be defined to bend the display module in a direction opposite to that of the "outward bending". Through the "inward bending", the portions of the second protective member PF-L (see FIG. 5B.) different from each other become farther, and the portions of the first protective member PF-U (see FIG. 5B.) different from each other become closer.

FIG. 8C is a plan view illustrating the front surface of the display module DM in a bent state. FIG. 8D is a plan view illustrating the back surface of the display module DM in bent state. As illustrated in FIGS. 8A and 8B, the bezel area BZ (see FIG. 1.) may be minimized by bending the non-display area NDA.

FIG. 8E is a cross-sectional view taken along lines V-V' of FIGS. 8C and 8D. In an embodiment, as illustrated in FIG. 8E, the display module DM may be bent with radii of curvature different from each other according to a bent form thereof. Parts bent inwards may have a first radius of curvature R10, and a part bent outwards may have a second radius of curvature R20 greater than the first radius of curvature R10. The parts bent inwards may have a same radius of curvature as each other.

The display panel DP, e.g., the circuit layer DP-CL (see FIG. 3.) may have different durability depending on the type of stress. The circuit layer DP-CL (see FIG. 3.) has lower durability against the tensile stress than against the compressive stress with a same strength.

At a part bent inwards illustrated in FIG. 8E, the circuit layer DP-CL (see FIG. 3.) may undergo the tensile stress in an embodiment where a mid-plane of the part bent inwards is defined in the second protective member PF-L. At the part bent outwards illustrated in FIG. 8E, the circuit layer DP-CL (see FIG. 3.) may undergo the compressive stress. A mid-plane of the part bent outwards may be defined in the first protective member PF-U. In an embodiment, the second radius of curvature R20 may be set to be greater than the first radius of curvature R10 to reduce the intensity of the tensile stress applied to the circuit layer DP-CL (see FIG. 3.) at the part bent inwards.

Figure 9A:
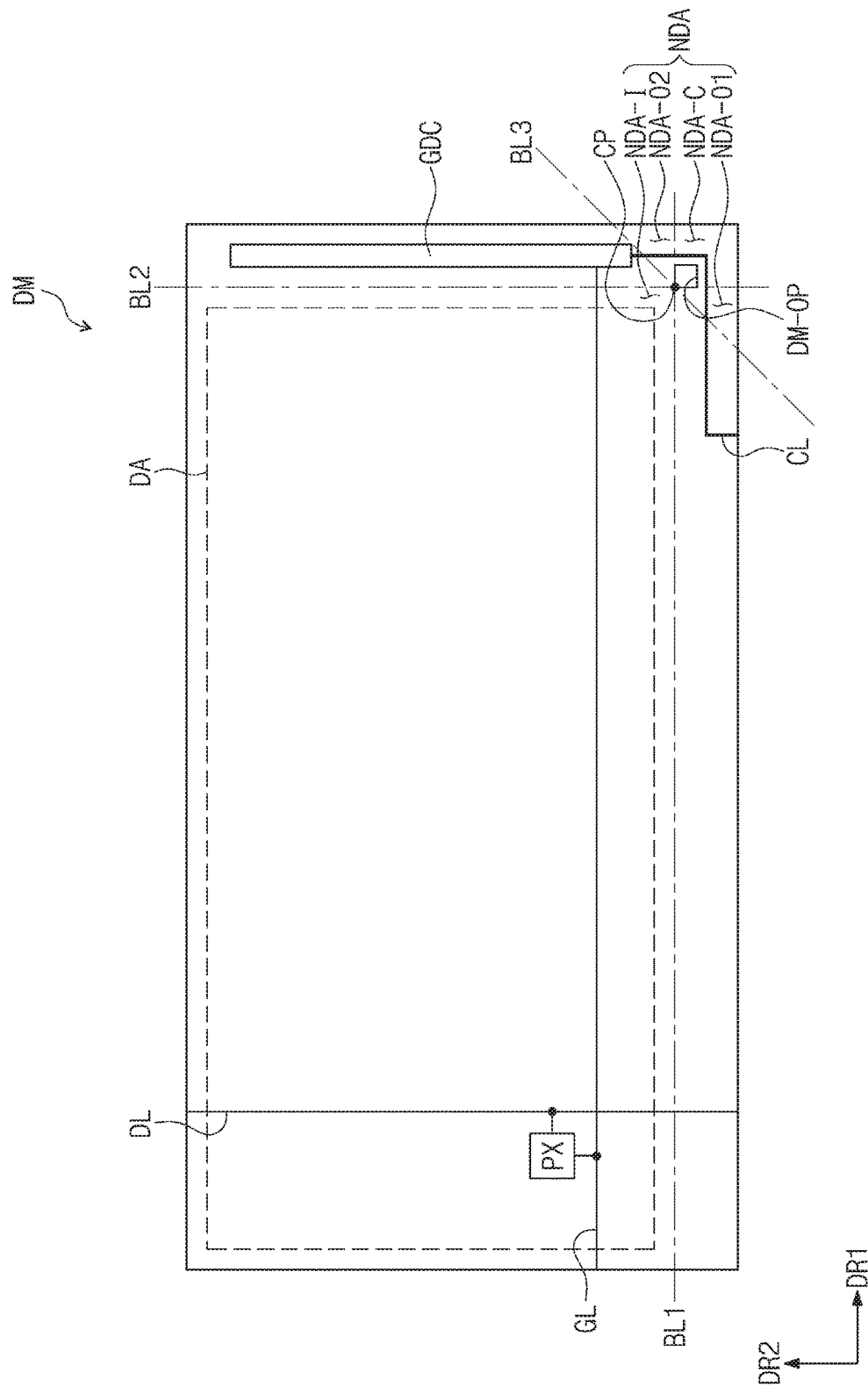
FIGS. 9A to 9C are plan views illustrating the display module, in unfolded states, according to alternative embodiments of the invention.
Figure 9B:
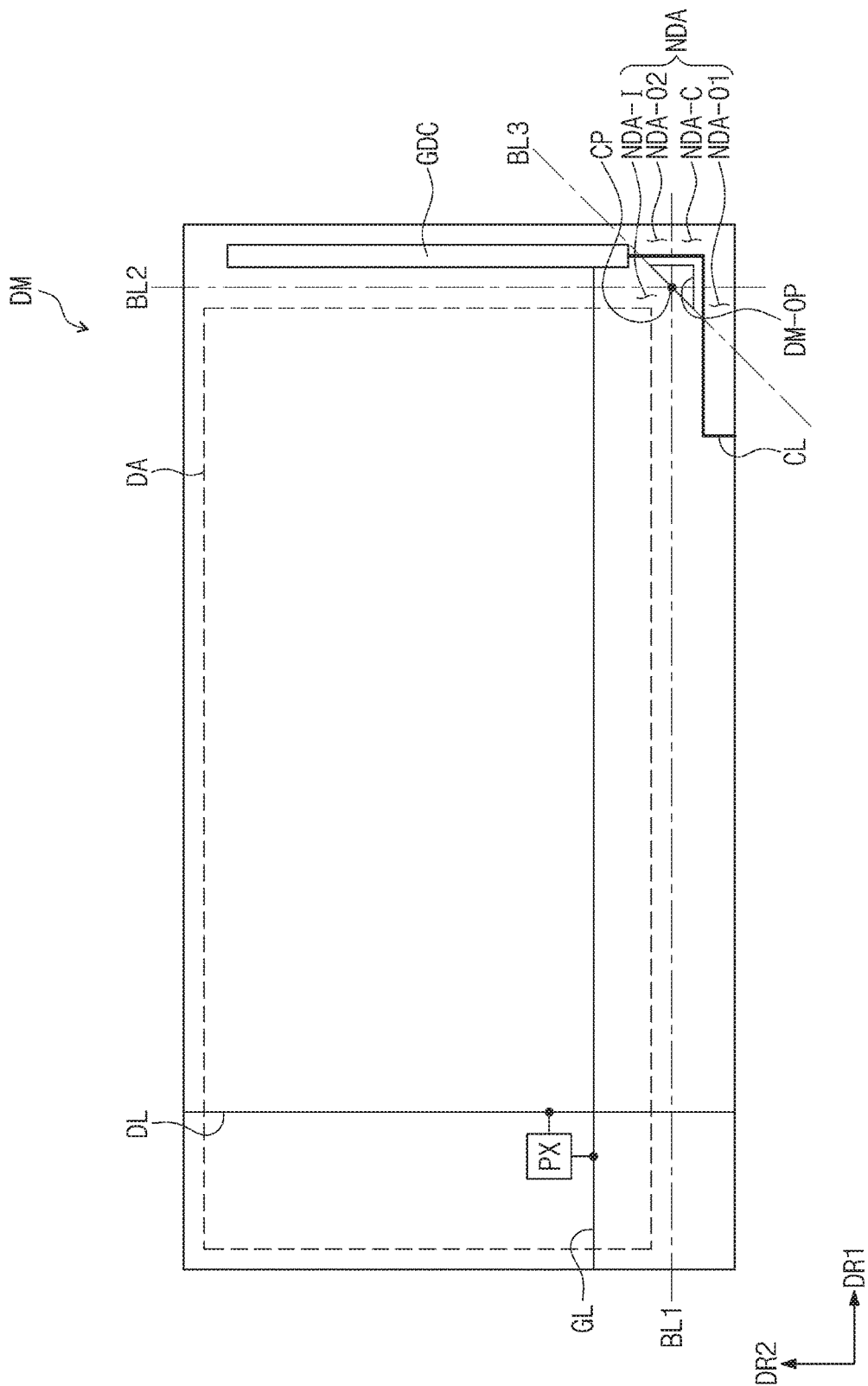
Figure 9C:
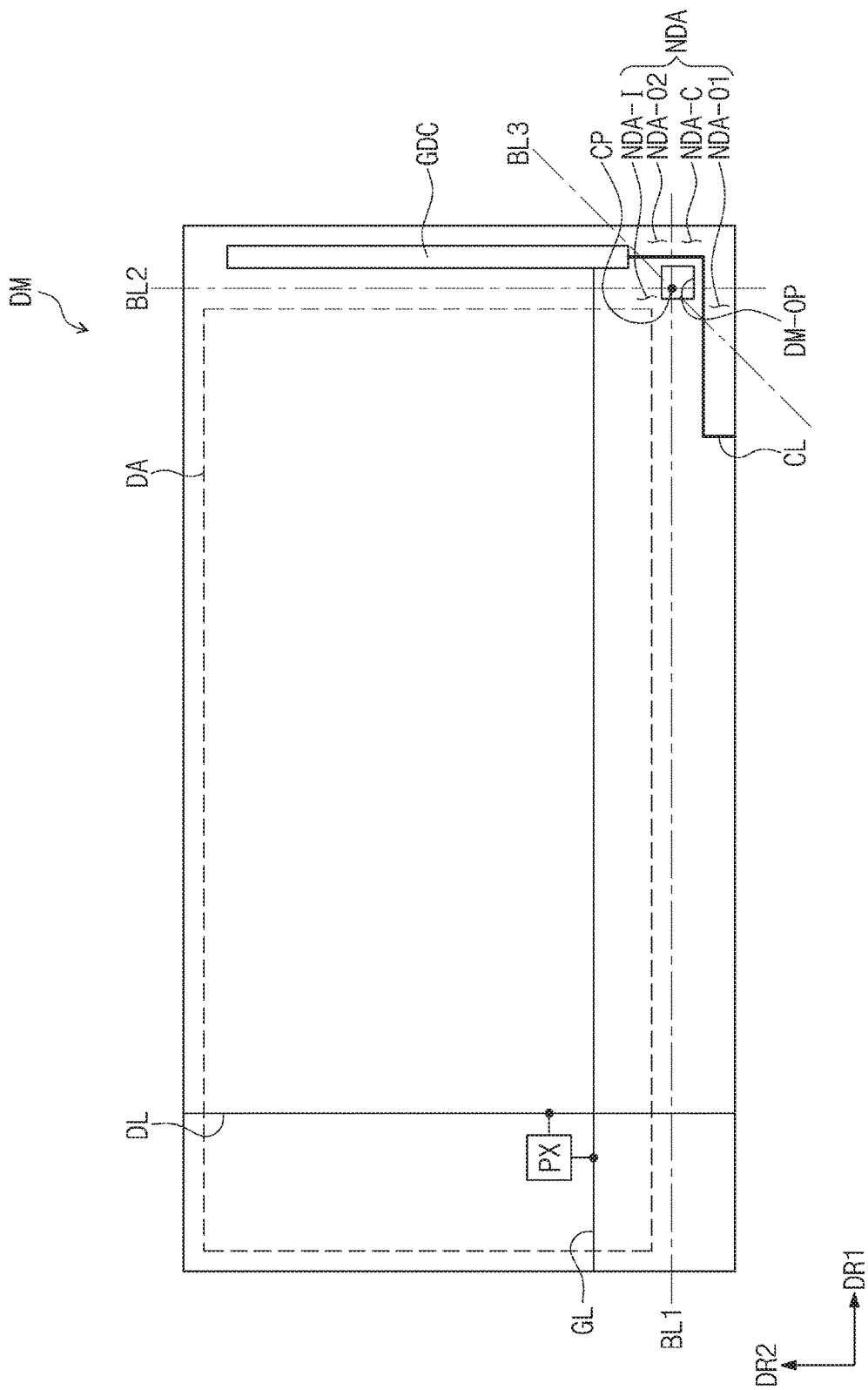

FIGS. 9A to 9C are plan views illustrating the display module DM, in unfolded states, according to alternative embodiment of the invention. Hereinafter, detailed description of the same configuration as in the display module DM described above referring to FIGS. 8A to 8E will be omitted or simplified.

In an embodiment, as illustrated in FIGS. 9A to 9C, an opening DM-OP overlapping the corner non-display area NDA-C is defined in the display module DM. In such an embodiment, the opening DM-OP is defined to prevent, as illustrated in FIGS. 8C and 8D, stress from being concentrated at the single point CP while the non-display area NDA is being bent.

Alternatively, though not illustrated separately, the opening DM-OP may be defined in the display panel DP (see FIG. 5B.). In another alternative embodiment, the opening DM-OP may be defined in at least one of the first protective member PF-U (see FIG. 5B.) or the second protective member PF-L (see FIG. 5B.). The opening DM-OP may also be defined in the display panel DP, the first protective member PF-U and the second protective member PF-L.

In such an embodiment, as illustrated in FIGS. 9A to 9C, the opening DM-OP may have various shapes when viewed in a plan view. Edges of the opening DM-OP may be parallel to any one of the first bending line BL1, the second bending line BL2 and the third bending line BL3. The edges of the opening DM-OP may overlap at least one of the first bending line BL1, the second bending line BL2 and the third bending line BL3.

In an embodiment, as illustrated in FIG. 9A, the opening DM-OP may have a rectangular shape when viewed in a plan view, and two edges thereof may respectively overlap the first bending line BL1 and the second bending line BL2. In an alternative embodiment, as illustrated in FIG. 9B, the opening DM-OP may have a triangular shape when viewed in a plan view, and one edge thereof may overlap the third bending line BL3.

In another alternative embodiment, as illustrated in FIG. 9C, the single point CP may be defined to be inside the opening DM-OP. The shape of the opening DM-OP is not particularly limited.

As described in detail, a display device with a reduced bezel area may be provided by bending the non-display area. A stress generated in the circuit layer may be effectively reduced by providing the slit in a region in which bent parts overlap each other. A stress generated in the circuit layer may be reduced by varying the radius of curvature of bent portion according to a bent form thereof (inward bending or outward bending).

Although the exemplary embodiments of the invention have been described herein, it is understood that various changes and modifications can be made by those skilled in the art within the spirit and scope of the invention defined by the following claims or the equivalents.

Therefore, the scope of the invention is defined by the following claims or the equivalents other than the foregoing detailed description.

What is claimed is:
1. A display device comprising:
   a display panel comprising a circuit layer and a display element layer; and
   a protective member disposed outside the display panel, wherein the circuit layer includes:
      a display area in which a pixel circuit is disposed; and a non-display area which is disposed in a periphery of the display area, and in which a first bending line and a second bending line crossing the first bending line are defined, wherein the non-display area includes:

a first non-display area disposed outside the first bending line, and inside the second bending line, and bent from the display area with respect to the first bending line;

a second non-display area disposed outside the second bending line and inside the first bending line, and bent from the display area with respect to the second bending line; and a corner non-display area disposed outside the first bending line, and outside the second bending line, bent from the second non-display area with respect to the first bending line, and bent from the first non-display area with respect to the second bending line, wherein a slit is defined in the protective member, wherein the slit overlaps at least one of a first part of the first bending line, a first part of the second bending line, a second part of the first bending line extending from the first part of the first bending line, and a second part of the second bending line extending from the first part of the second bending line, wherein the first part of the first bending line and the first part of the second bending line define a border of the corner non-display area, and the protective member comprises a plurality of base films and the first slit is defined through a part of the plurality of base films.

2. The display device of claim 1, wherein the circuit layer further comprises:

a driving circuit disposed in the second non-display area, wherein the driving circuit provides a driving signal to the pixel circuit; and a connection signal line connected to the driving circuit, and disposed to overlap the first non-display area, the second non-display area and the corner non-display area.

3. The display device of claim 2, further comprising:

a flexible printed circuit board coupled to the first non-display area, and electrically connected to the connection signal line.

4. The display device of claim 1, wherein the protective member comprises:

a first protective member disposed on a first surface of the display panel; and a second protective member disposed on a second surface of the display panel opposite to the first surface, wherein the slit includes at least one of:

a first slit defined to overlap the first part of the first bending line of the first protective member; and a second slit defined to overlap the second part of the first bending line of the first protective member.

5. The display device of claim 4, wherein the slit further comprises at least one of:

a third slit defined to overlap the first part of the first bending line of the second protective member; and a fourth slit defined to overlap the second part of the first bending line of the second protective member.

6. The display device of claim 5, wherein the first slit and the second slit are continuously connected to each other.

7. The display device of claim 5, wherein a length of the first slit and a length of the second slit are substantially equal to each other.

8. The display device of claim 5, wherein a width of the first slit is equal to or less than a width of the third slit, a width of the second slit is equal to or greater than a width of the fourth slit, and the width of the third slit is equal to or less than the width of the fourth slit.

9. The display device of claim 1, wherein the display element layer comprises an organic light-emitting diode connected to the pixel circuit.

10. A display device comprising:

a display panel; and a protective member disposed outside the display panel, wherein the display panel includes:

a display area in which a pixel is disposed; and a non-display area which is adjacent to a periphery of the display area, and in which a signal line is disposed, and a first bending line, a second bending line crossing the first bending line and a third bending line crossing the first bending line and the second bending line at a single point are defined, and wherein the non-display area includes:

a first non-display area disposed outside the first bending line and inside the second bending line, bent outwards from the display area with respect to the first bending line, and bent inwards with respect to the third bending line;

a second non-display area disposed outside the second bending line and inside the first bending line, bent outwards from the display area with respect to the second bending line, and bent inwards with respect to the third bending line; and a corner non-display area disposed outside the first bending line and outside the second bending line, bent outwards from the second non-display area with respect to the first bending line, and bent outwards from the first non-display area with respect to the second bending line.

11. The display device of claim 10, wherein the first non-display area is bent outwards with a first radius of curvature, and bent inwards with a second radius of curvature greater than the first radius of curvature.

12. The display device of claim 11, wherein the corner non-display area is bent outwards with a third radius of curvature substantially equal to the first radius of curvature.

13. The display device of claim 10, wherein a first opening is defined in the display panel to overlap the corner non-display area.

14. The display device of claim 13, wherein an edge of the first opening overlaps the third bending line.

15. The display device of claim 13, wherein an edge of the first opening overlaps the first bending line and the second bending line.

16. The display device of claim 13, wherein a single point is defined inside the first opening.

17. The display device of claim 13, wherein a second opening corresponding to the first opening is defined in the protective member.

18. The display device of claim 13, wherein the signal line comprises a connection signal line overlapping the first non-display area, the second non-display area and the corner non-display area.

19. The display device of claim 10, wherein the pixel comprises a pixel circuit, and an organic light-emitting diode electrically connected to the pixel circuit.

20. A display device comprising:

a display panel comprising a circuit layer and a display element layer;

a first protective member disposed on a first surface of the display panel; and a second protective member disposed on a second surface of the display panel opposite to the first surface, wherein the circuit layer includes:

a display area in which a pixel circuit is disposed; and a non-display area which is disposed in a periphery of the display area, and in which a first bending line and a second bending line crossing the first bending line are defined, wherein the non-display area includes:

a first non-display area disposed outside the first bending line, and inside the second bending line, and bent from the display area with respect to the first bending line;

a second non-display area disposed outside the second bending line and inside the first bending line, and bent from the display area with respect to the second bending line; and a corner non-display area disposed outside the first bending line, and outside the second bending line, bent from the second non-display area with respect to the first bending line, and bent from the first non-display area with respect to the second bending line, wherein the first bending line includes a first part and a second part extending from the first part and the second bending line includes a third part and a fourth part extending from the third part, wherein the first part of the first bending line and the third part of the second bending line define a border of the corner non-display area, wherein a first slit is defined in the first protective member to overlap the first part of the first bending line and a second slit is defined in the second protective member to overlap the first part of the first bending line, and a width of the first slit is equal to or less than a width of the second slit.

* * * * *